US012644947B2

(12) United States Patent
Li et al.

(10) Patent No.: US 12,644,947 B2
(45) Date of Patent: Jun. 2, 2026

(54) ANISOTROPIC MAGNETORESISTANCE SENSOR CIRCUIT WITH ADJUSTABLE OFFSET TRIM

(71) Applicant: TEXAS INSTRUMENTS INCORPORATED, Dallas, TX (US)

(72) Inventors: Qunying Li, Allen, TX (US); Shanmuganand Chellamuthu, Richardson, TX (US); Harish Kumar, Frisco, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 127 days.

(21) Appl. No.: 18/240,985

(22) Filed: Aug. 31, 2023

(65) Prior Publication Data

US 2025/0076442 A1    Mar. 6, 2025

(51) Int. Cl.
*G01R 35/00* (2006.01)
*G01D 5/244* (2006.01)
*G01D 5/245* (2006.01)
*G01R 33/09* (2006.01)

(52) U.S. Cl.
CPC ....... *G01R 35/005* (2013.01); *G01D 5/24428* (2013.01); *G01D 5/245* (2013.01); *G01R 33/096* (2013.01)

(58) Field of Classification Search
CPC ............... G01R 35/005; G01R 33/096; G01D 5/24428; G01D 5/245; G01D 5/145; G01D 3/036
See application file for complete search history.

(56) References Cited

U.S. PATENT DOCUMENTS

| | | | | |
|---|---|---|---|---|
| 7,119,802 B2 * | 10/2006 | Suyama | ............... | G09G 3/3655 |
| | | | | 345/98 |
| 2006/0158182 A1 * | 7/2006 | Omagari | ................ | G01R 33/02 |
| | | | | 324/244 |
| 2013/0002358 A1 * | 1/2013 | Mitchell | ............... | G01L 1/2281 |
| | | | | 330/297 |
| 2013/0015845 A1 * | 1/2013 | Fox | ...................... | G01R 33/091 |
| | | | | 324/207.21 |
| 2019/0018083 A1 * | 1/2019 | Fujiwara | .............. | G01R 33/098 |
| 2020/0033384 A1 * | 1/2020 | Kishi | ................... | G01R 15/207 |
| 2020/0119698 A1 * | 4/2020 | Purdila | .............. | H03F 3/45766 |
| 2023/0093616 A1 * | 3/2023 | Kimura | ................... | G01B 7/30 |
| | | | | 324/207.25 |

* cited by examiner

*Primary Examiner* — Feba Pothen
(74) *Attorney, Agent, or Firm* — Xianghui Huang; Frank D. Cimino

(57) ABSTRACT

A circuit includes an anisotropic magnetoresistance (AMR) sensor; an operational amplifier; and a calibration circuit. The AMR sensor has a first terminal, a second terminal, a third terminal, and a fourth terminal. The operational amplifier has a first terminal, a second terminal, a third terminal, and a fourth terminal. The first terminal of the operational amplifier is coupled to the second terminal of the AMR sensor. The second terminal of the operational amplifier is coupled to the third terminal of the AMR sensor. The calibration circuit is coupled to the first terminal of the operational amplifier. The calibration circuit is configured to provide an adjustable offset trim voltage at the first terminal of the operational amplifier to cancel out an offset voltage generated by the AMR sensor.

20 Claims, 14 Drawing Sheets

300A

302

310

304

306

END OF SHAFT

308

100B

300B

302

310

304

306

SIDE OF SHAFT

308

100B

300C

302

310

304

306

SIDE OF SHAFT ORTHOGONAL

TEMPERATURE

810

TEMPERATURE

1100

1102 — TRIM OUTPUT STAGE AND COMMON-MODE VOLTAGE OF GAIN CIRCUIT

1104 — TRIM FIRST AMR SENSOR OFFSET AT FIRST TARGET TEMPERATURE

1106 — TRIM SECOND AMR SENSOR OFFSET AT FIRST TARGET TEMPERATURE, THE SECOND AMR SENSOR ROTATED RELATIVE TO THE FIRST AMR SENSOR

1108 — TRIM FIRST AMR SENSOR OFFSET AT SECOND TARGET TEMPERATURE

1110 — TRIM SECOND AMR SENSOR OFFSET AT SECOND TARGET TEMPERATURE

ANISOTROPIC MAGNETORESISTANCE SENSOR CIRCUIT WITH ADJUSTABLE OFFSET TRIM

BACKGROUND

Anisotropic magnetoresistance (AMR) sensors vary in resistance as a function of orientation relative to an ambient magnetic field. The results of AMR sensors can be used for motor or shaft position monitoring and related control options. Errors can be introduced into AMR sensor results due to process, voltage, and temperature (PVT) variance.

SUMMARY

In an example, a circuit includes: an anisotropic magnetoresistance (AMR) sensor; an operational amplifier; and a calibration circuit. The AMR sensor has a first terminal, a second terminal, a third terminal, and a fourth terminal. The operational amplifier has a first terminal, a second terminal, a third terminal, and a fourth terminal, the first terminal of the operational amplifier coupled to the second terminal of the AMR sensor, the second terminal of the operational amplifier coupled to the third terminal of the AMR sensor. The calibration circuit is coupled to the first terminal of the operational amplifier. The calibration circuit is configured to provide an adjustable offset trim voltage at the first terminal of the operational amplifier to cancel out an offset voltage generated by the AMR sensor.

In another example, a circuit includes: a first AMR sensor; a first operational amplifier; a first calibration circuit; a second AMR sensor; a second operational amplifier; and a second calibration circuit. The first AMR sensor has a first terminal, a second terminal, a third terminal, and a fourth terminal. The first operational amplifier has a first terminal, a second terminal, a third terminal, and a fourth terminal. The first terminal of the first operational amplifier is coupled to the second terminal of the first AMR sensor. The second terminal of the first operational amplifier is coupled to the third terminal of the first AMR sensor. The first calibration circuit is coupled to the first terminal of the first operational amplifier. The first calibration circuit is configured to provide an offset trim voltage at the first terminal of the first operational amplifier that varies as a function of temperature. The second AMR sensor has a first terminal, a second terminal, a third terminal, and a fourth terminal. The second AMR sensor is rotated relative to the first AMR sensor. The second operational amplifier has a first terminal, a second terminal, a third terminal, and a fourth terminal. The first terminal of the second operational amplifier is coupled to the second terminal of the second AMR sensor. The second terminal of the second operational amplifier is coupled to the third terminal of the second AMR sensor. The second calibration circuit is coupled to the first terminal of the second operational amplifier. The second calibration circuit is configured to provide an offset trim voltage at the first terminal of the second operational amplifier that varies as a function of temperature.

In yet another example, an AMR sensor circuit includes: an AMR sensor; a gain circuit; and a calibration circuit. The AMR sensor is configured to: receive a voltage; and provide AMR sensor results responsive to the voltage and an ambient magnetic field. The gain circuit is coupled to the AMR sensor and is configured to: receive the AMR sensor results; and provide amplified results responsive to AMR sensor results. The calibration circuit is coupled to the gain circuit and is configured to apply a correction to the amplified results, wherein the correction varies as a function of temperature.

BRIEF DESCRIPTION OF THE DRAWINGS

FIGS. 7A to 7G are schematic diagrams showing example trim circuits related to the AMR sensor circuit of FIG. 6.

DETAILED DESCRIPTION

Figure 1:
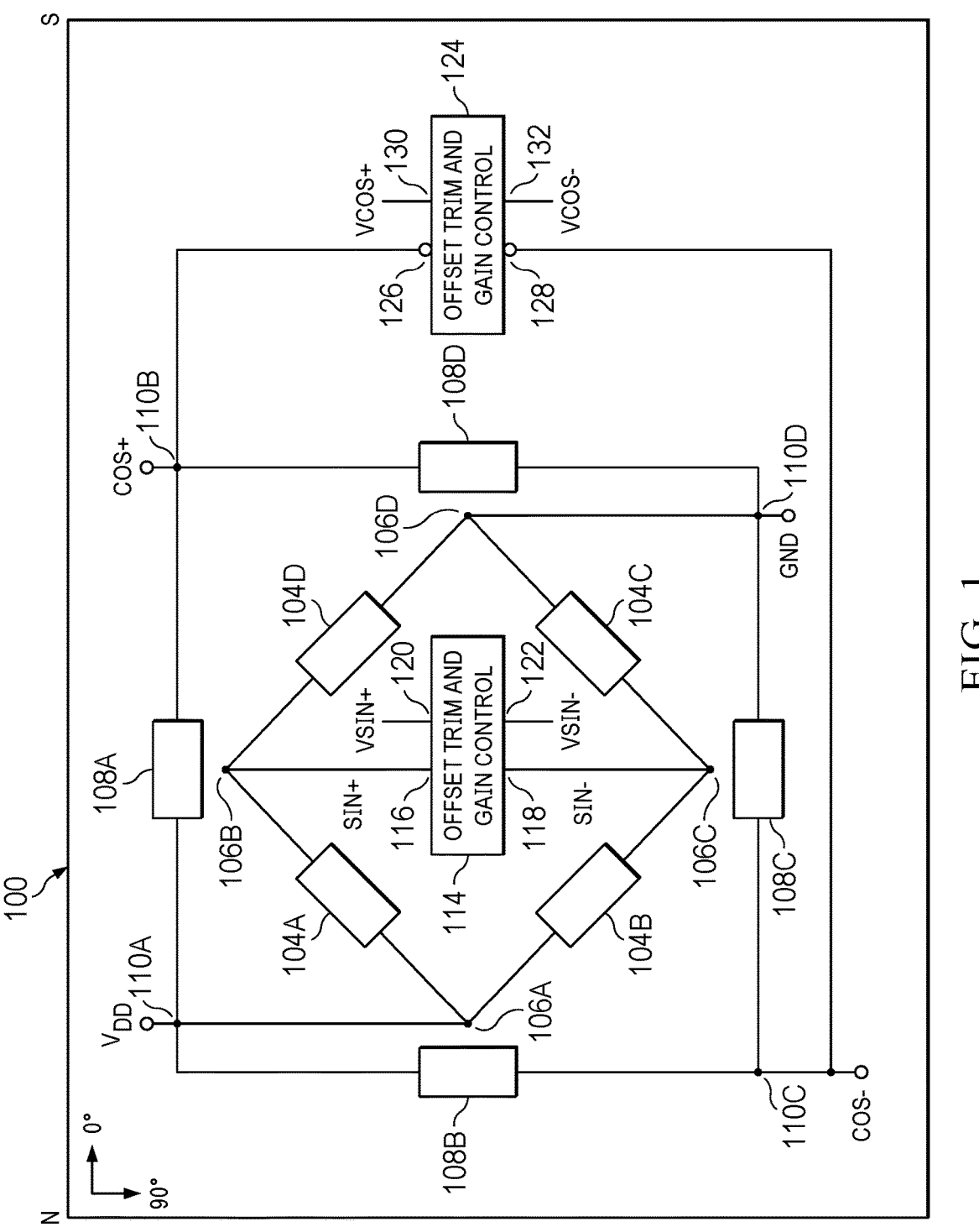
FIG. 1 is a diagram showing an example anisotropic magnetoresistance (AMR) sensor circuit with calibration circuitry.

The same reference numbers or other reference designators are used in the drawings to designate the same or similar features. Such features may be the same or similar either by function and/or structure.

Described herein are anisotropic magnetoresistance (AMR) sensor circuits that provide an adjustable offset trim. As used herein, an "AMR sensor" refers to a material having an electrical resistivity that varies as a function of ambient magnetic field strength or direction. In some examples, an AMR sensor includes a distributed layout of AMR material. An example distributed layout includes AMR material oriented in different directions (e.g., orthogonal directions) depending on a target sensing application. As used herein, "AMR offset" refers to variance in the output of an AMR sensor relative to an expected sense operation due to variances in manufacturing, ambient condition, and/or other factors. Temperature and bias current variances (the current passed through the AMR sensor during sense operations) are two factors that affect the AMR offset. Each AMR sensor may have a different AMR offset, and the AMR offset may vary over time. To account for AMR offset, the described AMR sensor circuits include offset trim control circuitry. In some examples, each AMR sensor circuit includes gain control circuitry, where the offset trim control circuitry operates to adjust reference currents, bias currents, and/or current mirroring options of the gain control circuitry to account for a particular AMR offset. Because the AMR offset for each AMR sensor varies and may change over time and for different ambient conditions, adjustments provided by the offset trim control circuitry may be dynamic and adjustable for each AMR sensor.

In different examples, the number of AMR sensors in an AMR sensor circuit may vary, and an AMR sensor circuit may include offset trim control circuitry for each AMR sensor. When multiple AMR sensors are used, different orientations for each sensor may be used. In some examples, AMR sensor circuits may include additional circuitry to store AMR sensor results, to process AMR sensor results, to derive related parameters from AMR sensor results, and/or to generate control signals responsive to AMR sensor results or derived related parameters. Examples of derived related parameters include the position or orientation of a shaft, the position or orientation of a motor, the position or orientation of a magnet, etc. Examples of additional circuitry that may be included with an AMR sensor circuit include analog-to-digital converters (ADCs), digital-to-analog converters (DACs), position monitoring circuitry, a quadrature encoder, and a motor controller. In some examples, a processor and memory with related instructions may perform position monitoring, quadrature encoding, and motor control, and/or other operations based on AMR sensor results.

In some examples, an AMR sensor circuit includes: a first integrated circuit (IC) having one or more AMR sensors; and a second IC having offset trim control circuitry for each AMR sensor of the first IC. In other examples, an AMR sensor circuit includes one IC that includes one or more AMR sensors and offset trim control circuitry for each AMR sensor of the IC. In different examples, additional circuitry of an AMR sensor circuit (e.g., to store AMR sensor results, to process AMR sensor results, to derive related parameters from AMR sensor results, and/or to generate control signals responsive to AMR sensor results or derived related parameters) may be included in the same IC or in one or more other ICs.

FIG. 1 is a diagram showing an example AMR sensor circuit 100 having offset trim control. As shown, the AMR sensor circuit 100 includes a first set of AMR components 104A to 104D and a second set of AMR components 108A to 108D. The first set of AMR components 104A to 104D is part of a first AMR sensor having a first terminal 106A, a second terminal 106B, a third terminal 106C, and a fourth terminal 106D. The second set of AMR components 108A to 108D is part of a second AMR sensor having a first terminal 110A, a second terminal 110B, a third terminal 110C, and a fourth terminal 110D. The AMR sensor circuit 100 also includes a first offset trim and gain control circuit 114 and a second offset trim and gain control circuit 124. The first offset trim and gain control circuit 114 has a first terminal 116, a second terminal 118, a third terminal 120, and a fourth terminal 122. The second offset trim and gain control circuit 124 has a first terminal 126, a second terminal 128, a third terminal 130, and a fourth terminal 132. The first offset trim and gain control circuit 114 and the second offset trim and gain control circuit 124 are examples of calibration circuitry for the AMR sensor circuit 100.

In the example of FIG. 1, the AMR components 104A and 104C are oriented +45 degrees relative to a north-south direction, and the AMR components 104B and 104D are oriented −45 degrees relative to the north-south direction. The AMR components 108A and 108C are oriented parallel with the north-south direction, and the AMR components 108B and 108D are oriented perpendicular to the north-south direction.

As shown, the first terminal 106A is coupled to a voltage supply ($V_{DD}$) terminal. The voltage supply terminal is coupled to a voltage supply (not shown) that provides a supply voltage (also referred to as $V_{DD}$). The AMR component 104A is coupled between the first terminal 106A and the second terminal 106B. The AMR component 104B is coupled between the first terminal 106A and the third terminal 106C. The AMR component 104C is coupled between the third terminal 106C and the fourth terminal 106D. The AMR component 104D is coupled between the second terminal 106B and the fourth terminal 106D. The fourth terminals 106D and 110D are coupled to a ground terminal or ground. As shown, the first terminal 116 of the first offset trim and gain control circuit 114 is coupled to the second terminal 106B. The second terminal 118 of the first offset trim and gain control circuit 114 is coupled to the third terminal 106C. The first terminal 126 of the second offset trim and gain control circuit 124 is coupled to the second terminal 110B. The second terminal 128 of the second offset trim and gain control circuit 124 is coupled to the third terminal 110C.

The first AMR sensor operates to: receive $V_{DD}$ at its first terminal 106A; provide first AMR results (SIN+) at its second terminal 106B responsive to $V_{DD}$ and the resistivity of the AMR components 104A and 104D in presence of an ambient magnetic field; and provide second AMR results (SIN−) at its third terminal 106C responsive to $V_{DD}$ and the resistivity of the AMR components 104B and 104C in presence of an ambient magnetic field. The second AMR sensor operates to: receive $V_{DD}$ at its first terminal 110A; provide third AMR results (COS+) at its second terminal 110B responsive to $V_{DD}$ and the resistivity of the AMR components 108A and 108D in presence of an ambient magnetic field; and provide fourth AMR results (COS−) at its third terminal 110C responsive to $V_{DD}$ and the resistivity of the AMR components 108B and 108C in presence of an ambient magnetic field.

The first offset and gain control circuit 114 operates to: receive SIN+ at its first terminal 116; receive SIN− at its second terminal 118; provide adjusted first AMR results (VSIN+) at its third terminal 120 responsive to SIN+ and operations of the first offset trim and gain control circuit 114; and provide adjusted second AMR results (VSIN−) at its fourth terminal 122 responsive to SIN− and operations of the first offset trim and gain control circuit 114. Example operations of the first offset trim and gain control circuit 114 include: receiving SIN+ and SIN− at a first target orientation for different temperatures; receiving a bias voltage (VBIAS); generating reference currents responsive to VBIAS; obtaining trim values responsive to the SIN+ and SIN− values at the target orientation and the different temperatures; and applying currents to a gain circuit responsive to the reference currents and the trim values to provide VSIN+ and VSIN−.

The second offset trim and gain control circuit 124 operates to: receive COS+ at its first terminal 126; receive COS− at its second terminal 128; provide adjusted first AMR results (VCOS+) at its third terminal 130 responsive to COS+ and operations of the second offset trim and gain control circuit 124; and provide adjusted second AMR results (VCOS−) at its fourth terminal 132 responsive to COS− and operations of the second offset trim and gain control circuit 124. Example operations of the second offset trim and gain control circuit 124 include: receiving COS+ and COS− at a target orientation for different temperatures; receiving VBIAS; generating reference currents responsive to VBIAS; obtaining trim values responsive to the COS+ and COS− values at the target orientation and the different temperatures; and applying currents to a gain circuit responsive to the reference currents and the trim values to provide VCOS+ and VCOS−. In some examples, VSIN+, VSIN−, VCOS+, and VCOS− are used to trim an offset voltage applied to a gain circuit (not shown).

Figure 2:
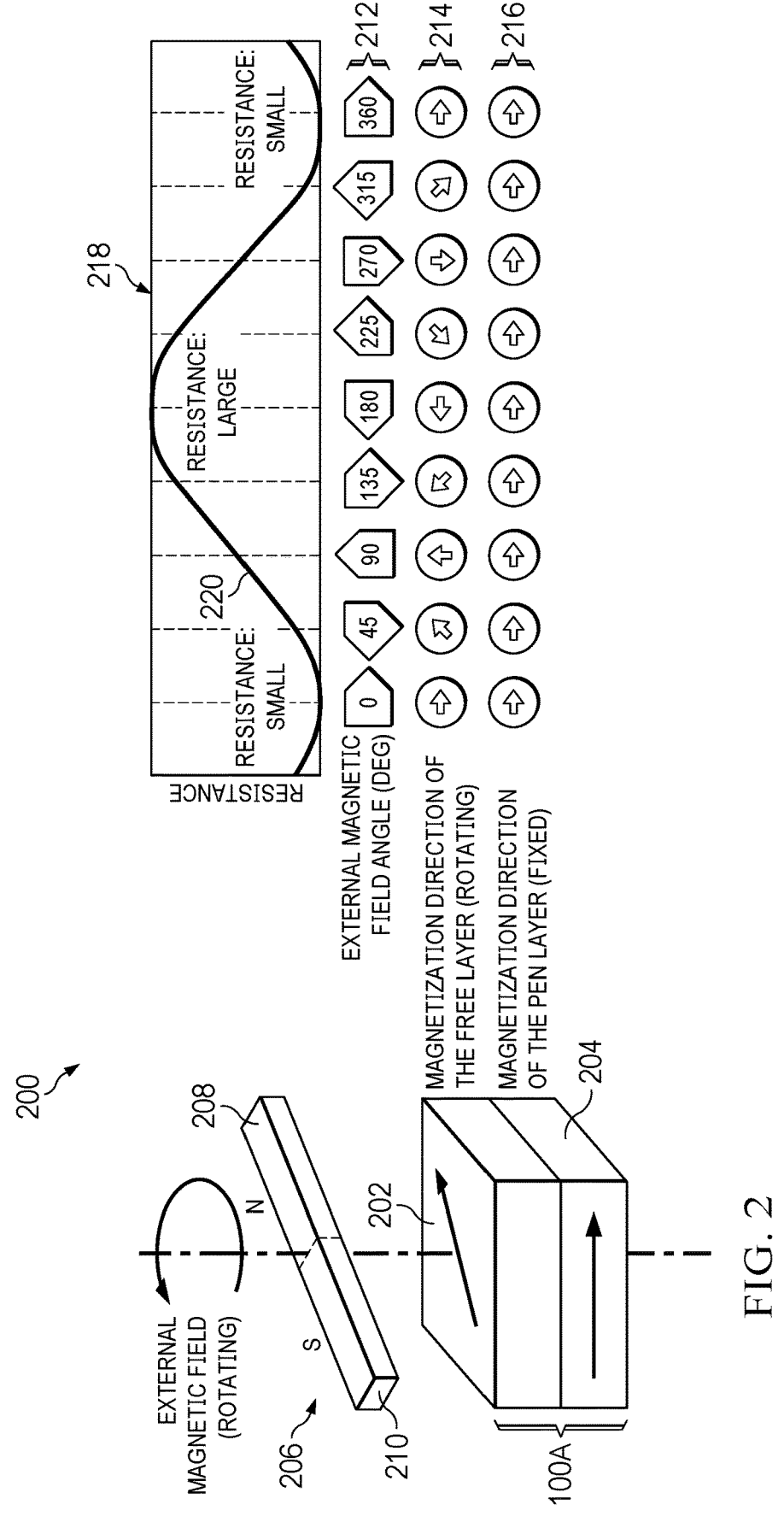
FIG. 2 is a diagram showing an example AMR sensor scenario and related parameters.

FIG. 2 is a diagram 200 showing an example AMR sensor scenario and related parameters. In the example of FIG. 2, the diagram 200 includes a rotating magnet 206 and an AMR sensor circuit 100A. The AMR sensor circuit 100A is an example of the AMR sensor circuit 100 in FIG. 1. The rotating magnet 206 has a first pole 208 (e.g., a north pole) and a second pole 210 (e.g., a south pole). The AMR sensor circuit 100A has a first layer 202 and a second layer 204. The rotating magnet 206 is axially offset from the AMR sensor circuit 100A and provides a rotating magnetic field.

In the example of FIG. 2, the diagram 200 shows magnetic field angle positions 212, magnetization directions 214 of the first layer 202 of the AMR sensor circuit 100A, a magnetization direction 216 of the second layer 204 of the AMR sensor circuit 100A, and a graph 218 showing AMR resistivity 220 as a function of the magnetic field angle positions 212.

In the example of FIG. 2, AMR resistivity 220 is at a minimum when the magnetic field angle is at 0 degrees. When the magnetic field angle is at 180 degrees, AMR resistivity 220 is at a maximum. At shown, the magnetization directions 214 of the first layer 202 of the AMR sensor circuit 100A matches the magnetic field angle positions 212. However, the magnetization direction 216 of the second layer 204 of the AMR sensor circuit 100A stays the same throughout (e.g., the magnetization direction 216 stays at 0 degrees). With AMR resistivity variance as a function of magnetic field angle, various AMR sensor use options are possible including magnetic field monitoring, shaft position monitoring, motor position monitoring, etc.

Figure 3A:
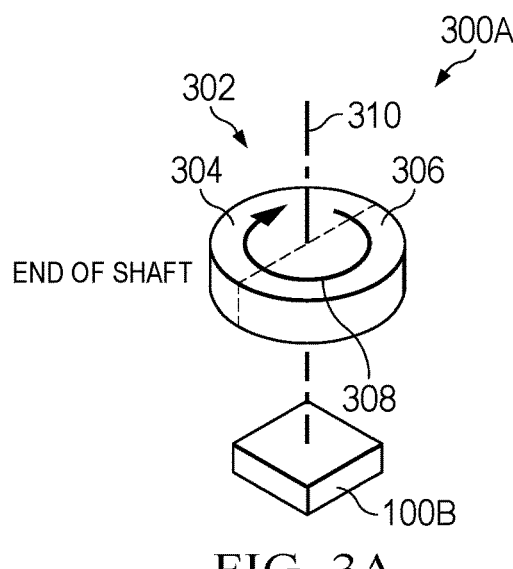
FIGS. 3A to 3C are diagrams showing example shaft position monitoring options using AMR sensors.
Figure 3B:
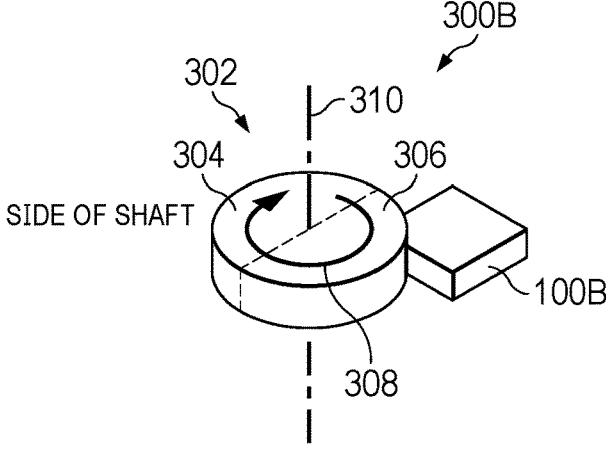
Figure 3C:
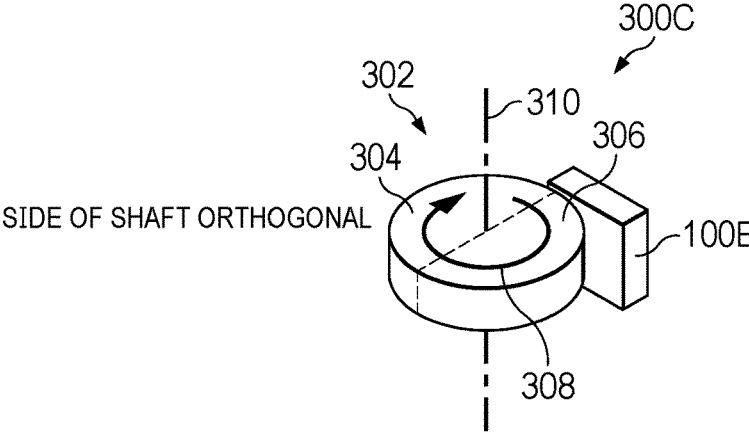

FIGS. 3A to 3C are diagrams 300A, 300B, and 300C showing example shaft position monitoring options using an AMR sensor circuit 100B. The AMR sensor circuit 100B is an example of the AMR sensor circuit 100 in FIG. 1, or the AMR sensor circuit 100A in FIG. 2. In the example of FIG. 3A, the diagram 300A includes a shaft 302 having a first pole 304 and a second pole 306. The shaft 302 has a direction of rotation 308, relative to an axis 310. In FIG. 3A, the AMR sensor circuit 100B is axially offset from (e.g., below) the shaft 302. Accordingly, the top of the AMR sensor circuit 100B has an end of shaft position and faces the end of the shaft 302. In some examples, an AMR sensor with an end of shaft position may be used for sense scenarios such as motor shaft angle position detection and speed detection.

In the example of FIG. 3B, the diagram 300B includes the shaft 302 having the first pole 304, the second pole 306, the direction of rotation 308, and the axis 310. As shown, the AMR sensor circuit 100B is transversely offset from (e.g., to the side of) the shaft 302. In the example of FIG. 3B, the top of the of the AMR sensor circuit 100B is beside and does not face the shaft 302. Accordingly, the AMR sensor circuit 100B has a side of shaft position in FIG. 3B. In some examples, an AMR sensor with a side of shaft position may be used for sense scenarios in which the AMR sensor circuit 100B cannot be put at the end of shaft. Example side of shaft sense scenarios include a ring magnet scenario, a steering angle positioning scenario, or robot arm joint angle sensing and control.

In the example of FIG. 3C, the diagram 300C includes the shaft 302 having the first pole 304, the second pole 306, the direction of rotation 308, and the axis 310. As shown, the AMR sensor circuit 100B is transversely offset from (e.g., to the side of) the shaft 302. In the example of FIG. 3C, the top of the of the AMR sensor circuit 100B faces a longitudinal side of the shaft 302. Accordingly, the AMR sensor circuit 100B in FIG. 3C has a side of shaft orthogonal position. In some examples, an AMR sensor with a side of shaft orthogonal position may be used for sense scenarios where the AMR sensor circuit 100B cannot be put at the end of the shaft. Example side of shaft orthogonal sense scenarios include throttle and/or pedal angle sensing and control.

Figure 4:
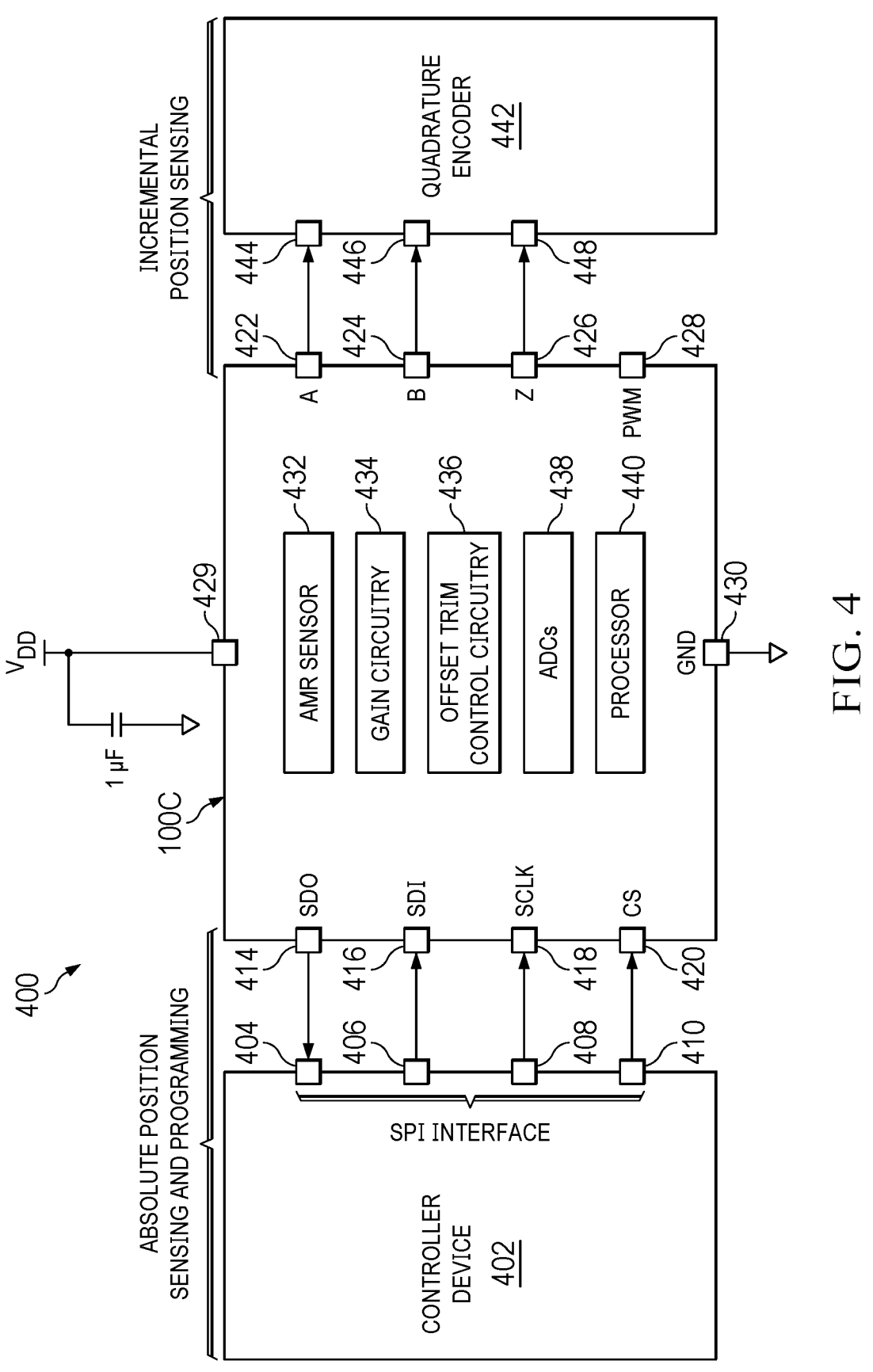
FIG. 4 is a block diagram showing an example position-based control system.

FIG. 4 is a block diagram showing an example position-based control system 400. As shown, the position-based control system 400 includes a controller device 402, an AMR sensor circuit 100C, and a quadrature encoder 442. The AMR sensor circuit 100C is an example of the AMR sensor circuit 100 of FIG. 1, the AMR sensor circuit 100A in FIG. 2, or the AMR sensor circuit 100B in FIGS. 3A, 3B, and 3C. The controller device 402 has a first terminal 404, a second terminal 406, a third terminal 408, and a fourth terminal 410. The AMR sensor circuit 100C has a first terminal 414, a second terminal 416, a third terminal 418, a fourth terminal 420, a fifth terminal 422, a sixth terminal 424, a seventh terminal 426, an eighth terminal 428, a ninth terminal 429, and a tenth terminal 430. In some examples, the AMR sensor circuit 100C includes an AMR sensor 432, gain circuitry 434, offset trim control circuitry 436, an analog-to-digital converter (ADC) 438, and a processor 440. In some examples, the AMR sensor 432 includes the first AMR circuit and the second AMR circuit described in FIG. 1. The gain circuitry 434 and the offset trim control circuitry 436 include components of the first offset trim and gain control circuit 114 and the second offset trim and gain control circuit 124 in FIG. 1. The quadrature encoder 442 has a first terminal 444, a second terminal 446, and a third terminal 448.

In the example of FIG. 4, the first terminal 404 of the controller device 402 is coupled to the first terminal 414 of the AMR sensor circuit 100C. The second terminal 406 of the controller device 402 is coupled to the second terminal 416 of the AMR sensor circuit 100C. The third terminal 408 of the controller device 402 is coupled to the third terminal 418 of the AMR sensor circuit 100C. The fourth terminal 410 of the controller device 402 is coupled to the fourth terminal 420 of the AMR sensor circuit 100C.

The fifth terminal 422 of the AMR sensor circuit 100C is coupled to the first terminal 444 of the quadrature encoder 442. The sixth terminal 424 of the AMR sensor circuit 100C is coupled to the second terminal 446 of the quadrature encoder 442. The seventh terminal 426 of the AMR sensor circuit 100C is coupled to the third terminal 448 of the quadrature encoder 442. In some examples, the eighth terminal 428 of the AMR sensor circuit 100C provides a pulse-width modulation (PWM) signal to transmit angle information. The ninth terminal 429 of the AMR sensor circuit 100C receives $V_{DD}$. The tenth terminal 430 of the AMR sensor circuit 100C is coupled to a ground terminal or ground.

The controller device 402 operates to perform absolute position sensing and programming. In some examples, the controller device 402 and AMR sensor circuit 100C include standard Serial Port Interface (SPI) terminals to support communications between a processor of the controller device 402 and the AMR sensor circuit 100C. In the example of FIG. 4, the first terminal 414 of the AMR sensor circuit 100C is an SPI data out (SDO) terminal, the second terminal 416 of the AMR sensor circuit 100C is an SPI data in (SDI) terminal, the third terminal 418 is an SPI clock (SCLK) terminal, and the fourth terminal 420 is a chip select (CS) terminal. In such case, the first terminal 404 of the controller device 402 is a main out, subnode in (MOSI) terminal. The second terminal 406 of the controller device 402 is a main in, subnode out (MISO) terminal. The third terminal 408 of the controller device 402 is an SCLK terminal, and the fourth terminal 410 of the controller device 402 is a CS terminal. In this example, the controller device 402 is an SPI main device, and the AMR sensor circuit 100C is the SPI sub-node. In other examples, the AMR sensor circuit 100C may be the SPI main device, and the controller device 402 is an SPI sub-node. In either case, bi-directional communications are supported between the controller device 402 and the AMR sensor circuit 100C. In some examples, the controller device 402 may send control signals or commands to the AMR sensor circuit 100C and receive angle information back from the AMR sensor circuit 100C for ongoing sense and control operations.

The AMR sensor circuit 100C operates to: trim an output stage and a common-mode voltage of the gain circuitry 434; trim an AMR sensor offset voltage applied to the gain circuitry 434 at a first target temperature; trim an AMR sensor offset voltage applied to the gain circuitry 434 at a second target temperature; obtain AMR results responsive to an ambient magnetic field and the trim results; digitize the AMR results; and determine position parameters responsive to the AMR results.

More specifically, the offset trim control circuitry 436 operates to: trim an output stage and a common-mode voltage of the gain circuitry 434; trim an AMR sensor offset voltage applied to the gain circuitry 434 at a first target temperature; and trim an AMR sensor offset voltage applied to the gain circuitry 434 at a second target temperature. The AMR sensor 432 operates to: receive $V_{DD}$; and provide AMR results responsive to $V_{DD}$ and an ambient magnetic field. The gain circuitry 434 operates to amplify the AMR results responsive to the trim results. The ADCs 438 operate to digitize the amplified AMR sine/cosine signal results. The processor 440 operates to determine the position parameters responsive to the digitized AMR results.

The quadrature encoder 442 operates to: receive angle information from the AMR sensor circuit 100C; and calculate the quadrature information and a magnetic turn count based on the angle information.

Figure 5:
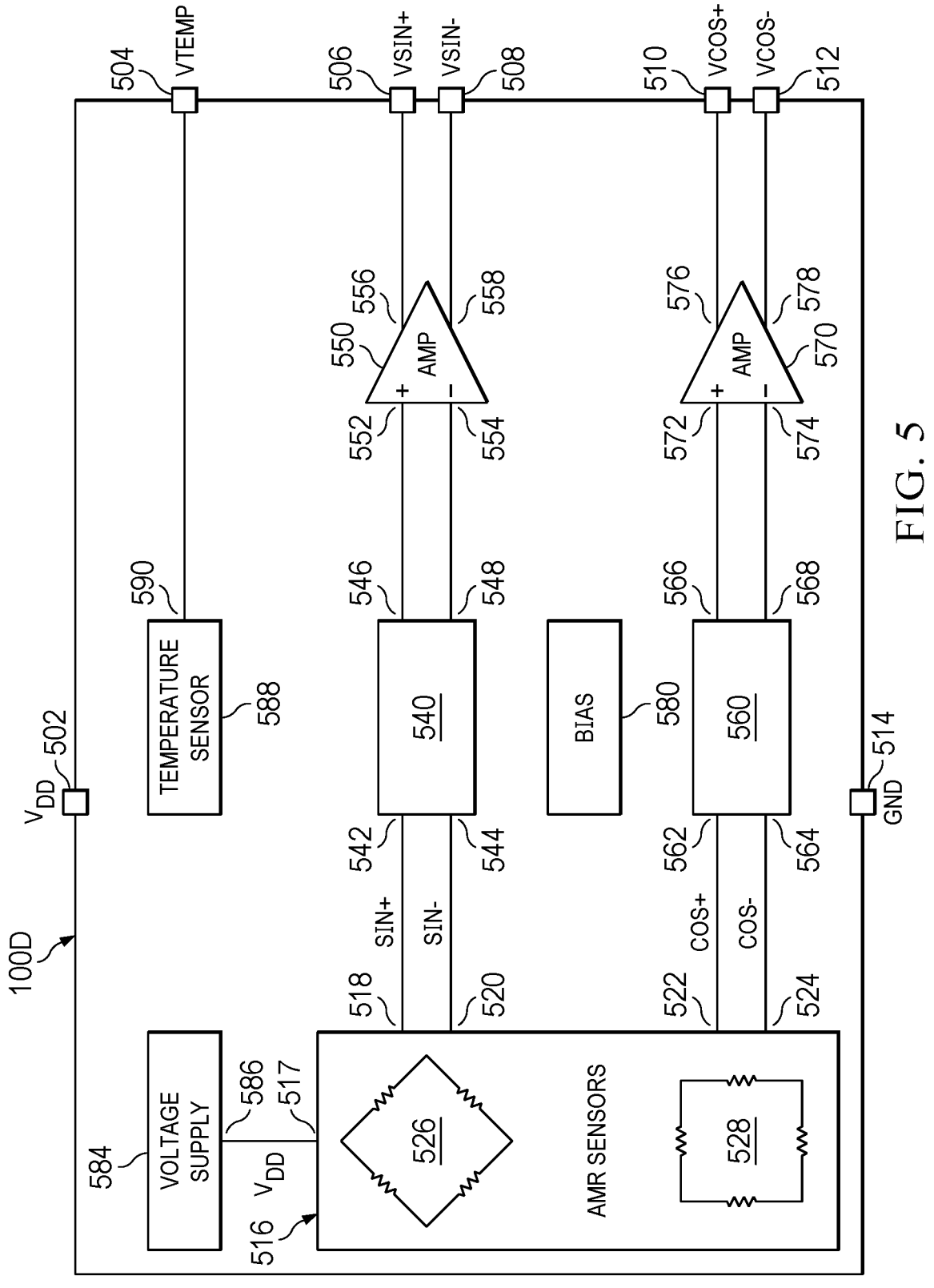
FIGS. 5 and 6 are block diagrams showing other example AMR sensor circuits with calibration circuitry.
Figure 6:
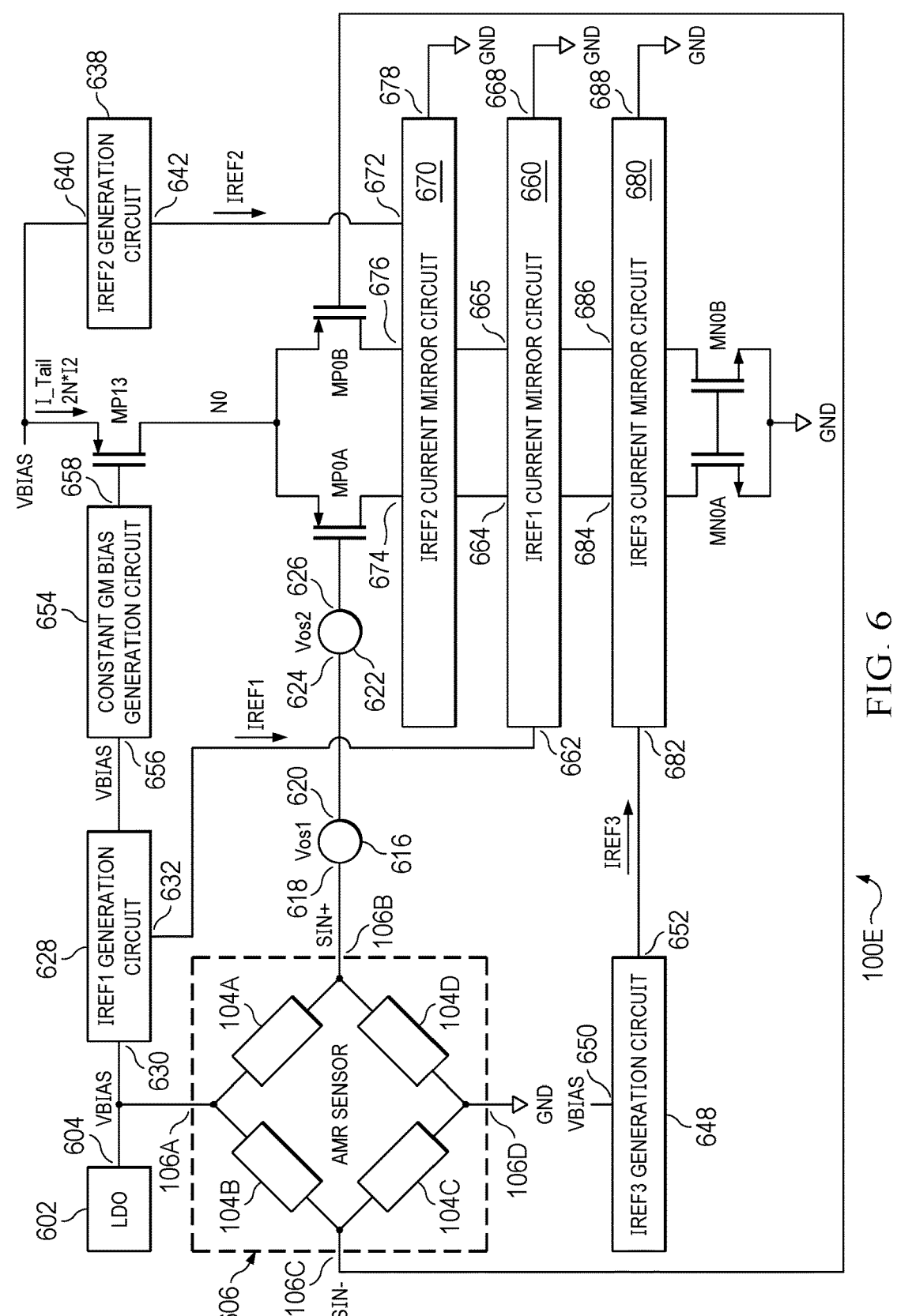

FIGS. 5 and 6 are block diagrams showing other example AMR sensor circuits 100D and 100E, respectively, having calibration circuitry. The AMR sensor circuit 100D in FIG. 5, and the AMR sensor circuit 100E in FIG. 6 are examples of the AMR sensor circuit 100 of FIG. 1, the AMR sensor circuit 100A in FIG. 2, the AMR sensor circuit 100B in FIGS. 3A, 3B, and 3C, or the AMR sensor circuit 100C in FIG. 4. In FIG. 5, first and second AMR sensors 526 and 528 with different orientations are shown along with respective first and second offset trim control circuits 540 and 560, respective gain control circuitry (e.g., the first operational amplifier 550 and the second operational amplifier 570). In comparison, FIG. 6 shows a single AMR sensor 606 (comparable to the first AMR sensor 526 of FIG. 5) and a more detailed example of offset trim control circuitry and gain control circuitry for the AMR sensor 606. As described herein, the number of AMR sensors of an AMR sensor circuit may vary as well as the number of ICs used to form an AMR sensor circuit. In some examples, the offset trim control circuitry and the gain control circuitry of FIG. 6 is an example of the first offset trim control circuit 540 and the first operational amplifier 550 of FIG. 5. Similar offset trim control circuitry and gain control circuitry to what is shown in FIG. 6 may be included for the second AMR sensor 528 of FIG. 5. Accordingly, an AMR sensor circuit may include offset trim control circuitry and gain control circuitry for each AMR sensor.

In the example of FIG. 5, the AMR sensor circuit 100D has a first terminal 502, a second terminal 504, a third terminal 506, a fourth terminal 508, a fifth terminal 510, a sixth terminal 512, and a seventh terminal 514. In some examples, the first terminal 502 is a $V_{DD}$ terminal. The second terminal 504 is a temperature voltage (VTEMP) terminal. The third terminal 506 is a VSIN+ terminal. The fourth terminal 508 is a VSIN− terminal. The fifth terminal 510 is a VCOS+ terminal. The sixth terminal 512 is a COS− terminal. The seventh terminal 514 is a ground terminal.

The AMR sensor circuit 100D includes AMR sensors 516 including a first AMR sensor 526 and a second AMR sensor 528. As shown, the first AMR sensor 526 is rotated relative to the second AMR sensor 528. The AMR sensors 516 has a first terminal 517, a second terminal 518, a third terminal 520, a fourth terminal 522, and a fifth terminal 524. The first AMR sensor 526 is an example of the first AMR sensor in FIG. 1. Accordingly, the resistors of the first AMR sensor 526 are examples of the first set of AMR components 104A to 104D in FIG. 1. The second AMR sensor 528 is an example of the second AMR sensor in FIG. 1. Accordingly, the resistors of the second AMR sensor 528 are examples of the second set of AMR components 108A to 108D in FIG. 1. The first terminal 517 of the AMR sensors 516 is an example of the first terminal 110A in FIG. 1. The second terminal 518 of the AMR sensors 516 is an example of the second terminal 106B in FIG. 1. The third terminal 520 of the AMR sensors 516 is an example of the third terminal 106C in FIG. 1. The fourth terminal 522 of the AMR sensors 516 is an example of the second terminal 110B in FIG. 1. The fifth terminal 524 of the AMR sensors 516 is an example of the third terminal 110C in FIG. 1.

In the example of FIG. 5, the AMR sensor circuit 100D also includes a first offset trim control circuit 540, a second offset trim control circuit 560, a first operational amplifier 550, a second operational amplifier 570, a bias voltage source 580, a voltage supply source 584, and a temperature sensor 588. In some examples, the first offset trim control circuit 540 is part of the first offset trim and gain control circuit 114 in FIG. 1 and/or is part of the offset trim control circuitry 436 in FIG. 4. The second offset trim control circuit 560 is part of the second offset trim and gain control circuit 124 in FIG. 1 and/or is part of the offset trim control circuitry 436 in FIG. 4. The first operational amplifier 550 is part of the first offset trim and gain control circuit 114 in FIG. 1 and/or is part of the gain circuitry 434 in FIG. 4. The second operational amplifier 570 is part of the second offset trim and gain control circuit 124 in FIG. 1 and/or is part of the gain circuitry 434 in FIG. 4.

As shown, the first offset trim control circuit 540 has a first terminal 542, a second terminal 544, a third terminal 546, and a fourth terminal 548. The second offset trim circuit 560 has a first terminal 562, a second terminal 564, a third terminal 566, and a fourth terminal 568. The first operational amplifier 550 has a first terminal 552, a second terminal 554, a third terminal 556, and fourth terminal 558. The second operational amplifier 570 has a first terminal 572, a second terminal 574, a third terminal 576, and a fourth terminal 578. The voltage supply source 584 has a terminal 586. The temperature sensor 588 has a terminal 590.

In the example of FIG. 5, the first terminal 517 of the AMR sensors 516 is coupled to the terminal 586 of the voltage supply source 584. The second terminal 518 of the AMR sensors 516 is coupled to the first terminal 542 of the first offset trim control circuit 540. The third terminal 520 of the AMR sensors 516 is coupled to the second terminal 544 of the first offset trim control circuit 540. The fourth terminal 522 of the AMR sensors 516 is coupled to the first terminal 562 of the second offset trim control circuit 560. The fifth terminal 524 of the AMR sensors 516 is coupled to the second terminal 564 of the second offset trim control circuit 560.

The third terminal 546 of the first offset trim control circuit 540 is coupled to the first terminal 552 (e.g., a non-inverting input) of the first operational amplifier 550.

The fourth terminal 548 of the first offset trim control circuit 540 is coupled to the second terminal 554 (e.g., an inverting input) of the first operational amplifier 550. The third terminal 556 of the first operational amplifier 550 is coupled to the third terminal 506 of the AMR sensor circuit 100D. The fourth terminal 558 of the first operational amplifier 550 is coupled to the fourth terminal 508 of the AMR sensor circuit 100D.

The third terminal 566 of the second offset trim control circuit 560 is coupled to the first terminal 572 (e.g., a non-inverting input) of the second operational amplifier 570. The fourth terminal 568 of the second offset trim control circuit 560 is coupled to the second terminal 574 (e.g., an inverting input) of the second operational amplifier 570. The third terminal 576 of the second operational amplifier 570 is coupled to the fifth terminal 510 of the AMR sensor circuit 100D. The fourth terminal 578 of the second operational amplifier 570 is coupled to the sixth terminal 512 of the AMR sensor circuit 100D.

In the example of FIG. 5, the bias voltage source 580 provides a bias voltage, such as a bandgap voltage reference ($V_{BG}$). The bias voltage source 580 also provides biasing currents to other components of the AMR sensor circuit 100D, such as the first offset trim control circuit 540, the second offset trim control circuit 560, the first operational amplifier 550, and the second operational amplifier 570. The terminal 590 of the temperature sensor 588 is coupled to the second terminal 504 of the AMR sensor circuit 100D.

The AMR sensor circuit 100D operates to: trim an output stage and a common-mode voltage for each of the first operational amplifier 550 and the second operational amplifier 570; trim an AMR sensor offset voltage applied to each of the first operational amplifier 550 and the second operational amplifier 570 at a first target temperature; trim an AMR sensor offset voltage applied to the each of the first operational amplifier 550 and the second operational amplifier 570 at a second target temperature; and provide AMR results responsive to an ambient magnetic field and the trim results. Example AMR results include VSIN+, VSIN−, VCOS+, and VCOS−.

More specifically, the AMR sensors 516 operate to: receive $V_{DD}$ at its first terminal 517; provide first AMR results (e.g., SIN+ results) at its second terminal 518 responsive to $V_{DD}$ and an ambient magnetic field; provide second AMR results (e.g., SIN− results) at its third terminal 520 responsive to $V_{DD}$ and an ambient magnetic field; provide third AMR results (e.g., COS+ results) at its fourth terminal 522 responsive to $V_{DD}$ and an ambient magnetic field; and provide fourth AMR results (e.g., COS− results) at its fifth terminal 524 responsive to $V_{DD}$ and an ambient magnetic field.

The bias voltage source 580 operates to provide VBIAS based on a target VBIAS reference. The voltage supply source 584 operates to provide $V_{DD}$ at its terminal 586 responsive to a target $V_{DD}$ reference. The temperature sensor 588 operates to provide a temperature sense signal (e.g., VTEMP) at its terminal 590 responsive to an ambient temperature and temperature sense operations of the temperature sensor 588. In some examples, the temperature sensor 588 uses a thermistor and/or other temperature-dependent components to generate VTEMP as a function of temperature.

The first offset trim control circuit 540 operates to: receive first AMR results (e.g., SIN+) at its first terminal 542; receive second AMR results (e.g., SIN−) at its second terminal 544; provide adjusted first amplified AMR results (VSIN+) at its third terminal 546 responsive to the first AMR results and operations of the first offset trim control circuit 540; and provide adjusted second amplified AMR results (VSIN−) at its fourth terminal 548 responsive to the second AMR results and operations of the first offset trim control circuit 540. Example operations of the second offset trim control circuit 540 include: receiving SIN+ and SIN− at a target orientation for different temperatures; receiving VBIAS; generating reference currents responsive to VBIAS; obtaining trim values responsive to the SIN+ and SIN− values at the target orientation and the different temperatures; and applying currents to the first operational amplifier 550 responsive to the reference currents and the trim values to provide VSIN+ and VSIN−. In some examples, the first offset trim control circuit 540 operates to: trim an AMR sensor offset voltage applied to the first operational amplifier 550 at a first target temperature and a first target orientation; and trim an AMR sensor offset voltage applied to the first operational amplifier 550 at a second target temperature and the first target orientation.

The second offset trim control circuit 560 operates to: receive third AMR results (e.g., COS+) at its first terminal 562; receive fourth AMR results (e.g., COS−) at its second terminal 564; provide adjusted third amplified AMR results (VCOS+) at its third terminal 566 responsive to the third AMR results and operations of the second offset trim control circuit 560; and provide adjusted fourth amplified AMR results (VCOS−) at its fourth terminal 568 responsive to the fourth AMR results and operations of the first offset trim control circuit 540. Example operations of the second offset trim control circuit 560 include: receiving COS+ and COS− at a target orientation for different temperatures; receiving VBIAS; generating reference currents responsive to VBIAS; obtaining trim values responsive to the COS+ and COS− values at the target orientation and the different temperatures; and applying currents to a gain circuit responsive to the reference currents and the trim values to provide VCOS+ and VCOS−. In some examples, the second offset trim control circuit 560 operates to: trim an AMR sensor offset voltage applied to the second operational amplifier 570 at the first target temperature and a second target orientation; and trim an AMR sensor offset voltage applied to the second operational amplifier 570 at the second target temperature and the second target orientation.

The first operational amplifier 550 operates to: receive SIN+ at its first terminal 552; receive SIN− at its second terminal 554; provide VSIN+ at its third terminal 556 responsive to SIN+ and gain settings of the first operational amplifier 550; and provide VSIN− at its fourth terminal 558 responsive to SIN− and gain settings of the first operational amplifier 550. In some examples, the gain settings of the first operational amplifier 550 are based on an output stage offset and a common-mode voltage of the first operational amplifier 550 being trimmed by the first offset trim control circuit 540.

The second operational amplifier 570 operates to: receive COS+ at its first terminal 572; receive COS− at its second terminal 574; provide VCOS+ at its third terminal 576 responsive to COS− and gain settings of the second operational amplifier 570; and provide VCOS− at its fourth terminal 578 responsive to COS− and gain settings of the second operational amplifier 570. In some examples, the gain settings of the second operational amplifier 570 are based on an output stage offset and a common-mode voltage of the second operational amplifier 570 being trimmed by the second offset trim control circuit 560.

In the example of FIG. 6, the AMR sensor circuit 100E includes a low dropout regulator (LDO) 602, an AMR sensor 606, a first offset voltage ($V_{os1}$) source 616, a second offset voltage ($V_{os2}$) source 622, a first reference current (IREF1) generation circuit 628, a second reference current (IREF2) generation circuit 638, a third reference current (IREF3) generation circuit 648, a constant transconductance (Gm) bias current generation circuit 654, an IREF1 current mirror circuit 660, an IREF2 current mirror circuit 670, and an IREF3 current mirror circuit 680. As shown, the AMR sensor circuit 100E also includes transistors MP13, MP0A, MP0B, MN0A, and MN0B.

The transistors MP13, MP0A, MP0B, MN0A, and MN0B are part of a gain circuit or analog front end (AFE) operation amplifier. In some examples, the transistors MP13, MP0A, MP0B, MN0A, and MN0B may be part of the first offset trim and gain control circuit 114 in FIG. 1, the second offset trim and gain control circuit 124 in FIG. 1, the gain circuitry 434 in FIG. 4, the first operational amplifier 550 in FIG. 5, or the second operational amplifier 570 in FIG. 5. The LDO 602 is an example of the voltage supply source 584 of FIG. 5. In some examples, the AMR sensor circuit 100E may include a second AMR sensor offset from the AMR sensor 606 to obtain COS+, COS−, VCOS+, and VCOS− results as described herein. In such examples, the $V_{os1}$ source 616, the $V_{os2}$ source 622, the IREF1 generation circuit 628, the IREF2 generation circuit 638, the IREF3 generation circuit 648, the constant Gm bias current generation circuit 654, the IREF1 current mirror circuit 660, the IREF2 current mirror circuit 670, and the IREF3 current mirror circuit 680 are repeated for the second AMR sensor.

In the example of FIG. 6, the LDO 602 has a terminal 604. The AMR sensor 606 has the first terminal 106A, the second terminal 106B, the third terminal 106C, the fourth terminal 106D, and includes the first set of AMR components 104A to 104D described in FIG. 1. Accordingly, AMR sensor 606 is an example of the first AMR sensor in FIG. 1. The $V_{os1}$ source 616 has a first terminal 618 and a second terminal 620. The $V_{os2}$ source 622 has a first terminal 624 and a second terminal 626. The IREF1 generation circuit 628 has a first terminal 630 and a second terminal 632. The IREF2 generation circuit 638 has a first terminal 640 and a second terminal 642. The IREF3 generation circuit 648 has a first terminal 650 and a second terminal 652. The constant Gm bias current generation circuit 654 has a first terminal 656 and a second terminal 658. In some examples, the IREF1 generation circuit 628, the IREF2 generation circuit 638, the IREF3 generation circuit 648, and the constant Gm bias current generation circuit 654 may each include a ground terminal (not shown).

The IREF1 current mirror circuit 660 has a first terminal 662, a second terminal 664, a third terminal 665, and a fourth terminal 668. The IREF2 current mirror 670 has a first terminal 672, a second terminal 674, a third terminal 676, and a fourth terminal 678. The IREF3 current mirror 680 has a first terminal 682, a second terminal 684, a third terminal 686, and a fourth terminal 688. Each of the transistors MP13, MP0A, and MP0B is a p-channel metal oxide semiconductor (PMOS) transistor having a respective first terminal, a respective second terminal, and a respective control terminal. Each of the transistors MN0A and MN0B is an n-channel metal oxide semiconductor (NMOS) transistor having a respective first terminal, a respective second terminal, and a respective control terminal.

In the example of FIG. 6, the first terminal 106A of the AMR sensor 606 is coupled to the terminal 604 of the LDO 602. The second terminal 106B of the AMR sensor 606 is coupled to the control terminal of the transistor MP0A. The third terminal 106C of the AMR sensor 606 is coupled to the control terminal of the transistor MP0B. The fourth terminal 106D of the AMR sensor 606 is coupled to a ground terminal or ground. The first terminal 618 of the $V_{os1}$ source 616 is coupled to the second terminal 106B. The second terminal 620 of the $V_{os1}$ source 616 is coupled to the first terminal 624 of the $V_{os2}$ source 622. The second terminal 626 of the $V_{os2}$ source 622 is coupled to the control terminal of the transistor MP0A. $V_{os1}$ represents the offset generated by AMR sensor 606. $V_{os2}$ represents the input-referred equivalent offset to cancel out $V_{os1}$. In the example of FIG. 6, $V_{os2}$ is provided by trim circuits such as the IREF1 generation circuit 628, the IREF2 generation circuit 638, the IREF3 generation circuit 648, the IREF1 current mirror circuit 660, the IREF2 current mirror circuit 670, IREF3 current mirror circuit 680, and the constant Gm bias current generation circuit 654.

The first terminal 630 of the IREF1 generation circuit 628 is coupled to the terminal 604 of the LDO 602. The second terminal 632 of the IREF1 generation circuit 628 is coupled to the first terminal 662 of the IREF1 current mirror circuit 660. The second terminal 664 of the IREF1 current mirror circuit 660 is coupled to the second terminal of the transistor MP0A and to the first terminal of the transistor MN0A. The third terminal 665 of the IREF1 current mirror circuit 660 is coupled to the second terminal of the transistor MP0B and to the first terminal of the transistor MN0B. The fourth terminal 668 of the IREF1 current mirror circuit 660 is coupled to a ground terminal or ground.

The first terminal 640 of the IREF2 generation circuit 638 is coupled to the terminal 604 of the LDO 602. The second terminal 642 of the IREF2 generation circuit 638 is coupled to the first terminal 672 of the IREF2 current mirror circuit 670. The second terminal 674 of the IREF2 current mirror circuit 670 is coupled to the second terminal of the transistor MP0A and to the first terminal of the transistor MN0A. The third terminal 676 of the IREF2 current mirror circuit 670 is coupled to the second terminal of the transistor MP0B and to the first terminal of the transistor MN0B. The fourth terminal 678 of the IREF2 current mirror circuit 670 is coupled to a ground terminal or ground.

The first terminal 648 of the IREF3 generation circuit 648 is coupled to the terminal 604 of the LDO 602. The second terminal 652 of the IREF3 generation circuit 648 is coupled to the first terminal 682 of the IREF3 current mirror circuit 680. The second terminal 684 of the IREF3 current mirror circuit 680 is coupled to the second terminal of the transistor MP0A and to the first terminal of the transistor MN0A. The third terminal 686 of the IREF3 current mirror circuit 680 is coupled to the second terminal of the transistor MP0B and to the first terminal of the transistor MN0B. The fourth terminal 688 of the IREF3 current mirror circuit 680 is coupled to a ground terminal or ground. The second terminals of the transistor MN0A and MN0B are coupled to a ground terminal or ground.

The first terminal 656 of the constant Gm bias current generation circuit 654 is coupled to the terminal 604 of the LDO 602. The second terminal 658 of the constant Gm bias current generation circuit 654 is coupled to the control terminal of the transistor MP13. The first terminal of transistor MP13 is coupled to the terminal 604 of the LDO 602. The second terminal of the transistor MP13 is coupled to the first terminals of the transistors MP0A and MP0B.

In the example of FIG. 6, the LDO 602 operates to generate VBIAS responsive to a target bias voltage reference. The IREF1 generation circuit 628 operates to: receive VBIAS at its first terminal 630; and provide IREF1 at its second terminal 632 responsive to VBIAS and a target IREF1 reference. The IREF2 generation circuit 638 operates to: receive VBIAS at its first terminal 640; and provide IREF2 at its second terminal 642 responsive to VBIAS and a target IREF2 reference. The IREF3 generation circuit 648 operates to: receive VBIAS at its first terminal 650; and provide IREF3 at its second terminal 652 responsive to VBIAS and a target IREF3 reference. The constant Gm bias current generation circuit 654 operates to: receive VBIAS at its first terminal 656; and provide a gate control signal at its second terminal 658 responsive to VBIAS and a target constant Gm bias setting. With constant Gm bias current generation, the bias current varies as needed to maintain a constant transconductance for the transistor MP13. As used herein, "constant transconductance" refers to a target transconductance accurate to within a predetermined tolerance.

The IREF1 current mirror circuit 660 operates to: receive IREF1 at its first terminal 662; provide a first mirrored current at its second terminal 664 responsive to IREF1 and scaling control signals; and provide a second mirrored current at its third terminal 665 responsive to IREF1 and scaling control signals. The IREF2 current mirror circuit 670 operates to: receive IREF2 at its first terminal 672; provide a first mirrored current at its second terminal 674 responsive to IREF2 and scaling control signals; and provide a second mirrored current at its third terminal 676 responsive to IREF2 and scaling control signals. The IREF3 current mirror circuit 680 operates to: receive IREF3 at its first terminal 682; provide a first mirrored current at its second terminal 684 responsive to IREF3 and scaling control signals; and provide a second mirrored current at its third terminal 686 responsive to IREF3 and scaling control signals. In some examples, the scaling control signals for the IREF1 current mirror circuit 660, the IREF2 current mirror circuit 670, and the IREF3 current mirror circuit 680 are obtained by testing the AMR sensor circuit 100E at different temperatures and generating the scaling control signals responsive to the testing results. As used herein, "scaling control signals" refer to transistor gate control signals to select which transistors of a scalable current mirror topology are turned on or off.

The AMR sensor 606 operates to: receive VBIAS at its first terminal 106A; provide first AMR results at its second terminal 106B responsive to VBIAS and an ambient magnetic field; and provide second AMR results at its third terminal 106C responsive to VBIAS and an ambient magnetic field. The first and second AMR results are a function of the resistivity of the first set of AMR components 104A to 104D, which varies depending on the orientation of the set of AMR components 104A to 104D relative to the direction of magnetic flux of the ambient magnetic field.

In the example of FIG. 6, $V_{os1}$ and $V_{os2}$ are added to the differential output (SIN+ minus SIN−) of the AMR sensor 606. Again, $V_{os1}$ represents the offset originally generated by the AMR sensor 606. $V_{os2}$ represents the input-referred equivalent offset to track and cancel out $V_{os1}$. In the example of FIG. 6, $V_{os2}$ is produced by the AFE operational amplifier (which includes the transistors MP13, MP0A, MP0B, MN0A, MN) and related trim circuits. Example trim circuits include the IREF1 generation circuit 628A, the IREF2 generation circuit 638A, the IREF3 generation circuit 648A, the IREF1 current mirror circuit 660A, the IREF2 current mirror circuit 670A, the IREF3 current mirror circuit 680A, and the constant Gm bias current generation circuit 654A. In some examples, $V_{os1}$ is modeled as:

14

$$V_{os1} = V_{os0} * VBIAS + TC1 * (Temp − 27),\qquad \text{Equation (1)}$$

where $V_{os0}$ can be a random value within +/−2.91 mV/V, TC1 can be a random value within +/−0.072 mV/C, and Temp is a measured temperature. In Equation (1), the first term ($V_{os0}$*VBIAS) is a random variable only dependent on VBIAS, and the second term TC1*(Temp−27) is another random variable only dependent on temperature drift. These two terms are completely independent or uncorrelated with each other.

Figure 7A:
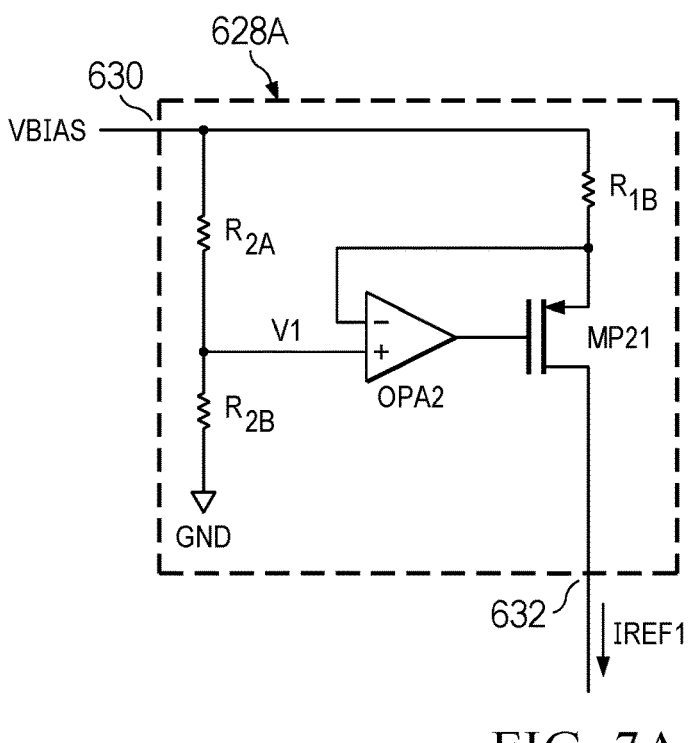
Figure 7B:
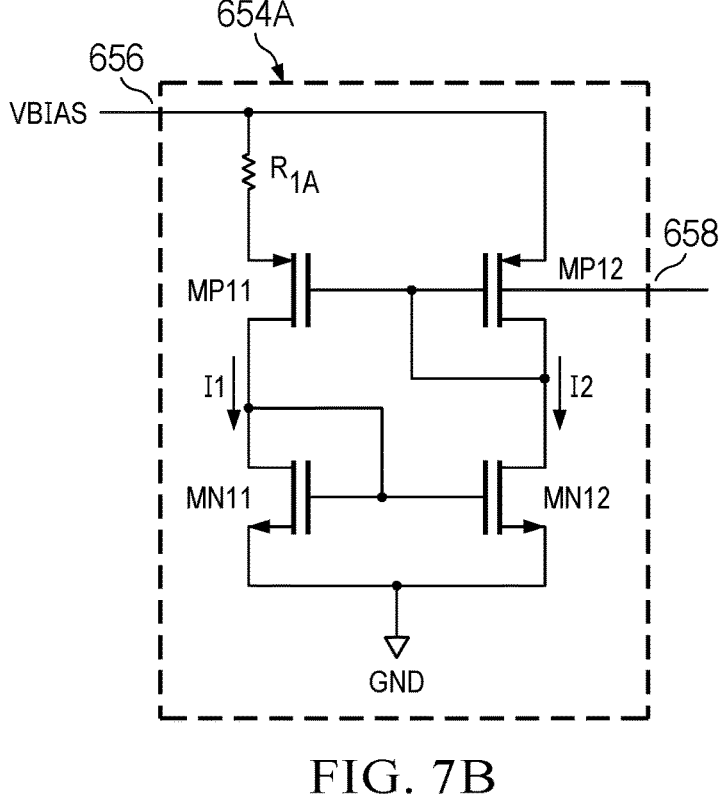
Figure 7C:
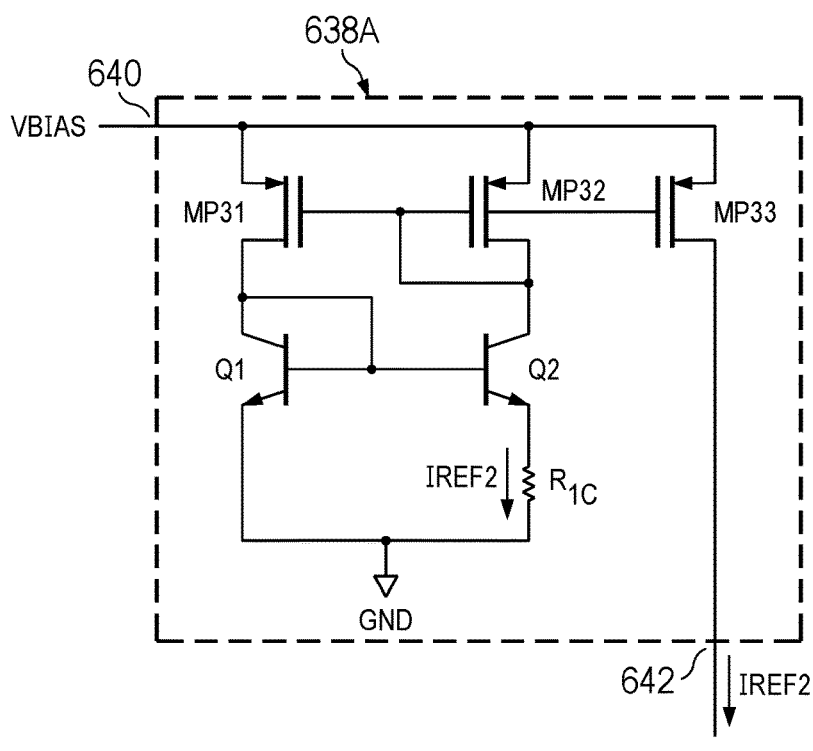
Figure 7D:
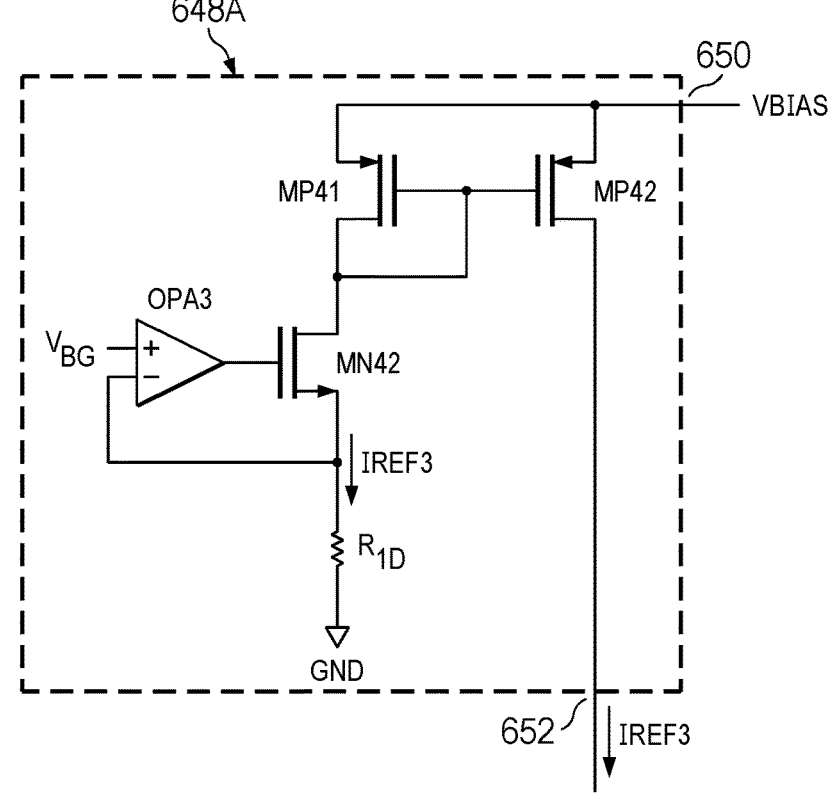
Figures 7E, 7F:
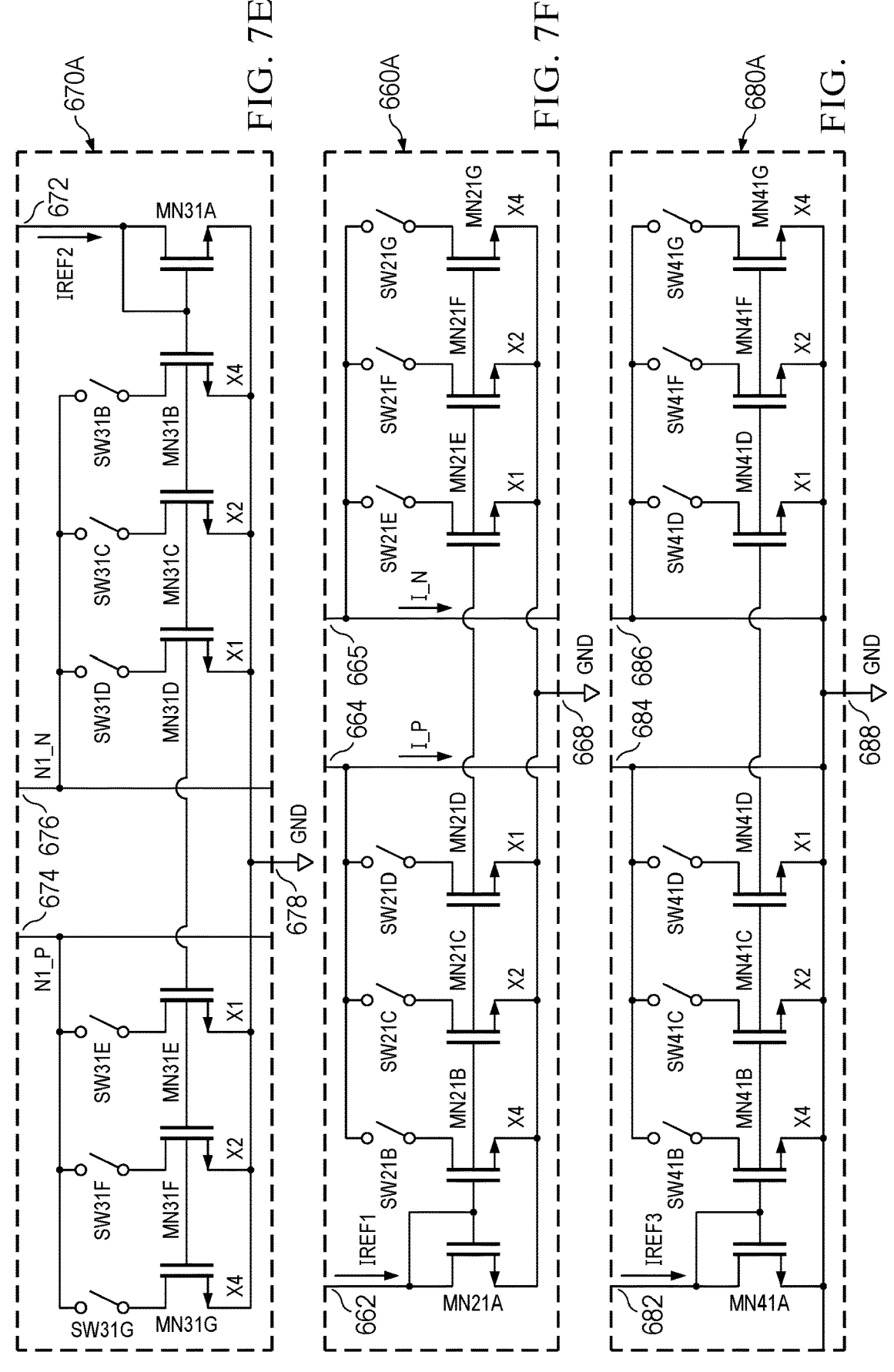

FIGS. 7A to 7G are schematic diagrams showing example trim circuits related to the AMR sensor circuit 100E of FIG. 6. In FIG. 7A, an IREF1 generation circuit 628A is shown, which is an example of the IREF1 generation circuit 628 in FIG. 6. In FIG. 7B, a constant Gm bias current generation circuit 654A is shown, which is an example of the constant Gm bias current generation circuit 654 in FIG. 6. In FIG. 7C, an IREF2 generation circuit 638A is shown, which is an example of the IREF2 generation circuit 638 in FIG. 6. In FIG. 7D, an IREF3 generation circuit 648A is shown, which is an example of the IREF3 generation circuit 648 in FIG. 6. In FIG. 7E, an IREF2 current mirror circuit 670A is shown, which is an example of the IREF2 current mirror circuit 670 in FIG. 6. In FIG. 7F, an IREF1 current mirror circuit 660A is shown, which is an example of the IREF1 current mirror circuit 660 in FIG. 6. In FIG. 7G, an IREF3 current mirror circuit 680A is shown, which is an example of the IREF3 current mirror circuit 680 in FIG. 6.

In the example of FIG. 7A, the IREF1 generation circuit 628A has the first terminal 630 and the second terminal 632, and includes an operational amplifier OPA2, transistor MP21, resistors $R_{1B}$, $R_{2A}$, and $R_{2B}$ in the arrangement shown. The transistor MP21 is a PMOS transistor having a first terminal, a second terminal, and a control terminal. The operational amplifier OPA2 has an inverting ("−") input, a non-inverting ("+") input, and an output. Each of the resistors $R_{1B}$, $R_{2A}$, and $R_{2B}$ has a respective first terminal and a respective second terminal.

In the example of FIG. 7A, the first terminal 630 of the IREF1 generation circuit 628A is coupled to the first terminals of the resistors $R_{1B}$ and $R_{2A}$. The second terminal of the resistor $R_{2A}$ is coupled to the first terminal of the resistor $R_{2B}$. The second terminal of the resistor $R_{2B}$ is coupled to a ground terminal or ground. The second terminal of the resistor $R_{2A}$ and the first terminal of the resistor $R_{2B}$ are coupled to the non-inverting ("+") input of the operational amplifier OPA2. The second terminal of the resistor $R_{1B}$ is coupled to the inverting ("−") input of the operational amplifier OPA2 and to the first terminal of the transistor MP21. The output of the operational amplifier OPA2 is coupled to the control terminal of the transistor MP21. The second terminal 632 of the IREF1 generation circuit 628A is coupled to the second terminal of the transistor MP21. In the example of FIG. 7A, the IREF1 generation circuit 628A operates to: receive VBIAS at its first terminal 630; and provide a target IREF1 reference at its second terminal 632 linearly proportional to VBIAS based on the arrangement of the operational amplifier OPA2 and the resistors $R_{2A}$, $R_{2B}$, and $R_{1B}$.

In the example of FIG. 7B, the constant Gm bias current generation circuit 654A has the first terminal 656 and the second terminal 658, and includes a resistor $R_{1A}$, and transistors MP11, MP12, MN11, and MN12 in the arrangement shown. The resistor RIA has a first terminal and a second terminal. Each of the transistors MP11 and MP12 is a PMOS transistor having a respective first terminal, a respective second terminal, and a respective control terminal. Each of the transistors MN11 and MN12 is an NMOS transistor having a respective first terminal, a respective second terminal, and a respective control terminal.

The first terminal 656 of the constant Gm bias current generation circuit 654A is coupled to the first terminal of the resistor $R_{1A}$ and to the first terminal of the transistor MP12. The second terminal of the resistor $R_{1A}$ is coupled to the first terminal of the transistor MP11. The second terminal of the transistor MP11 is coupled to the first terminal of the transistor MN11 and to the control terminals of the transistors MN11 and MN12. The second terminal of the transistor MP12 is coupled to the first terminal of the transistor MN12, to the control terminals of the transistors MP11 and MP12, and the second terminal 658 of the constant Gm bias current generation circuit 654A. The second terminals of the transistors MN11 and MN12 are coupled to a ground terminal or ground. In the example of FIG. 7B, the constant Gm bias current generation circuit 654A operates to: receive VBIAS at its first terminal 656; and provide a gate control signal at its second terminal 658 responsive to VBIAS and a target constant Gm bias setting based on the arrangement of the resistor $R_{1A}$, and the transistors MP11, MP12, MN11, and MN12.

In the example of FIG. 7C, the IREF2 generation circuit 638A has the first terminal 640 and the second terminal 642, and includes transistors MP31, MP32, MP33, Q1, and Q2, and a resistor Ric in the arrangement shown. Each of the transistors MP31, MP32 and MP33 is a PMOS transistor having a respective first terminal, a respective second terminal, and a respective control terminal. Each of the transistors Q1 and Q2 is an NPN bipolar junction transistor (BJT) having a respective first terminal, a respective second terminal, and a respective control terminal. The resistor Ric has a first terminal and a second terminal.

The first terminal 640 of the IREF2 generation circuit 638A is coupled to the first terminals of the transistors MP31, MP32, and MP33. The second terminal of the transistor MP31 is coupled to the first terminal of the transistor Q1 and to the control terminals of the transistors Q1 and Q2. The second terminal of the transistor Q1 is coupled to a ground terminal or ground. The second terminal of the transistor M32 is coupled to the first terminal of the transistor Q2 and to the control terminals of the transistors MP31, MP32, and MP33. The second terminal of the transistor Q2 is coupled to the first terminal of the resistor Ric. The second terminal of the resistor Ric is coupled to a ground terminal or ground. The second terminal 642 of the IREF2 generation circuit 638A is coupled to the second terminal of the transistor MP33. In the example of FIG. 7C, the IREF2 generation circuit 638A operates to: receive VBIAS at its first terminal 640; force two equal amount currents into bipolar devices Q1 and Q2 with different emitter area; and provide a target Proportional to Absolute Temperature (PTAT) current IREF2 reference based on the arrangement of the transistors MP31, MP32, MP33, Q1, Q2, and the resistor $R_{1C}$.

In the example of FIG. 7D, the IREF3 generation circuit 648A has the first terminal 650 and the second terminal 652, and includes an operational amplifier OPA3, transistors MP41, MP42, MN42, and resistor $R_{1D}$ in the arrangement shown. The operational amplifier OPA3 has an inverting ("−") input, a non-inverting ("+") input, and an output. Each of the transistors MP41 and MP42 is a PMOS transistor having a respective first terminal, a respective second terminal, and a respective control terminal. The transistor MN42 is an NMOS transistor having a first terminal, a second terminal, and a third terminal. The resistor $R_{1D}$ has a first terminal and a second terminal.

The first terminal 650 of the IREF3 generation circuit 648A is coupled to the first terminals of the transistors MP41 and MP42. The second terminal of the transistor MP41 is coupled to the first terminal of the transistor MN42 and to the control terminals of the transistors MP41 and MP42. The second terminal of the transistor MN42 is coupled to the first terminal of the resistor $R_{1D}$ and to the inverting ("−") input of the operational amplifier OPA3. The second terminal of the resistor $R_{1D}$ is coupled to a ground terminal or ground. The non-inverting ("+") input of the operational amplifier OPA3 receives $V_{BG}$. The second terminal 652 of the IREF3 generation circuit 648A is coupled to the second terminal of the transistor MP42. In the example of FIG. 7D, the IREF3 generation circuit 648A operates to: receive VBIAS at its first terminal 650; and provide IREF3 at its second terminal 652 responsive to VBIAS and a target IREF3 reference based on the arrangement of the operational amplifier OPA3, the transistors MP41, MP42, MN42, and the resistor $R_{1D}$. In the example of FIG. 7D, the target IREF3 reference is adjustable by controlling the control terminal voltage of the transistor MN42. In some examples, the operational amplifier OPA3 adjusts the control terminal voltage to the transistor MN42 by comparison of $V_{BG}$ with the voltage at the first terminal of the resistor $R_{1D}$. The IREF3 generated by control of the transistor MN42 is mirrored by the transistors MP41 and MP42 to the second terminal 652.

In the example of FIG. 7E, the IREF2 current mirror circuit 670A has the first terminal 672, the second terminal 674, the third terminal 676, and the fourth terminal 678, and includes transistors MN31A, MN31B, MN31C, MN31D, MN31E, MN31F, and MN31G, and switches SW31B, SW31C, SW31D, SW31E, SW31F, and SW31G in the arrangement shown. Each of the transistors MN31A, MN31B, MN31C, MN31D, MN31E, MN31F, and MN31G is an NMOS transistor having a respective first terminal, a respective second terminal, and a respective control terminal. In some examples, each of the switches SW31B, SW31C, SW31D, SW31E, SW31F, and SW31G are NMOS transistors. In other examples, PMOS transistors may be used for the switches SW31B, SW31C, SW31D, SW31E, SW31F, and SW31G.

The first terminal 672 of the IREF2 current mirror circuit 670A is coupled to the first terminal of the transistor MN31A and to the control terminals of the transistors MN31A, MN31B, MN31C, MN31D, MN31E, MN31F, and MN31G. The first terminal of the transistor MN31B is coupled to the first terminal of the switch SW31B. The first terminal of the transistor MN31C is coupled to the first terminal of the switch SW31C. The first terminal of the transistor MN31D is coupled to the first terminal of the switch SW31D. The first terminal of the transistor MN31E is coupled to the first terminal of the switch SW31E. The first terminal of the transistor MN31F is coupled to the first terminal of the switch SW31F. The first terminal of the transistor MN31G is coupled to the first terminal of the switch SW31G. The second terminals of the switches SW31B, SW31C, and SW31D are coupled to the third terminal 676 of the IREF2 current mirror circuit 670A. The second terminals of the switches SW31E, SW31F, and SW31G are coupled to the second terminal 674 of the IREF2 current mirror circuit 670A. The second terminals of the transistors MN31A, MN31B, MN31C, MN31D, MN31E, MN31F, and MN31G are coupled to a ground terminal or ground. The control terminals of the transistors SW31B, SW31C, SW31D, SW31E, SW31F, and SW31G are controlled by EERPROM/OTP memory bits (not shown), which are programmed so that the overall offset is as close to zero as possible during a circuit testing phase. In the example of FIG. 7E, the IREF2 current mirror circuit 670A operates to: receive IREF2 at its first terminal 672; provide a first mirrored current at its second terminal 674 responsive to IREF2 and scaling control signals for switches SW31E, SW31F, and SW31G; and provide a second mirrored current at its third terminal 676 responsive to IREF2 and scaling control signals for switches SW31B, SW31C, and SW31D.

In the example of FIG. 7F, the IREF1 current mirror circuit 660A has the first terminal 662, the second terminal 664, the third terminal 665, and the fourth terminal 668, and includes transistors MN21A, MN21B, MN21C, MN21D, MN21E, MN21F, and MN21G, and switches SW21B, SW21C, SW21D, SW21E, SW21F, and SW21G in the arrangement shown. Each of the transistors MN21A, MN21B, MN21C, MN21D, MN21E, MN21F, and MN21G is an NMOS transistor having a respective first terminal, a respective second terminal, and a respective control terminal. In some examples, each of the switches SW21B, SW21C, SW21D, SW21E, SW21F, and SW21G are NMOS transistors having a respective first terminal, a respective second terminal, and a respective control terminal. In other examples, PMOS transistors may be used for the switches SW21B, SW21C, SW21D, SW21E, SW21F, and SW21G.

The first terminal 662 of the IREF1 current mirror circuit 660A is coupled to the first terminal of the transistor MN21A and to the control terminals of the transistors MN21A, MN21B, MN21C, MN21D, MN21E, MN21F, and MN21G. The first terminal of the transistor MN21B is coupled to the first terminal of the switch SW21B. The first terminal of the transistor MN21C is coupled to the first terminal of the switch SW21C. The first terminal of the transistor MN21D is coupled to the first terminal of the switch SW21D. The first terminal of the transistor MN21E is coupled to the first terminal of the switch SW21E. The first terminal of the transistor MN21F is coupled to the first terminal of the switch SW21F. The first terminal of the transistor MN21G is coupled to the first terminal of the switch SW21G. The second terminals of the switches SW21B, SW21C, and SW21D are coupled to the second terminal 664 of the IREF1 current mirror circuit 660A. The second terminals of the switches SW21E, SW21F, and SW21G are coupled to the third terminal 665 of the IREF1 current mirror circuit 660A. The second terminals of the transistors MN21A, MN21B, MN21C, MN21D, MN21E, MN21F, and MN21G are coupled to a ground terminal or ground. The control terminals of the switches SW21B, SW21C, SW21D, SW21E, SW21F, and SW21G are controlled based on EEPROM/OTP memory bits (not shown), which are programmed so that the overall offset is as close to zero as possible during a circuit testing phase. In the example of FIG. 7F, the IREF1 current mirror circuit 660A operates to: receive IREF1 at its first terminal 662; provide a first mirrored current at its second terminal 664 responsive to IREF1 and scaling control signals for the switches SW21B, SW21C, and SW21D; and provide a second mirrored current at its third terminal 665 responsive to IREF1 and scaling control signals for switches SW21E, SW21F, and SW21G.

In the example of FIG. 7G, the IREF3 current mirror circuit 680A has the first terminal 682, the second terminal 684, the third terminal 686, and the fourth terminal 688, and includes transistors MN41A, MN41B, MN41C, MN41D, MN41E, MN41F, and MN41G, and switches SW41B, SW41C, SW41D, SW41E, SW41F, and SW41G in the arrangement shown. Each of the transistors MN41A, MN41B, MN41C, MN41D, MN41E, MN41F, and MN41G is an NMOS transistor having a respective first terminal, a respective second terminal, and a respective control terminal. In some examples, each of the switches SW41B, SW41C, SW41D, SW41E, SW41F, and SW41G are NMOS transistors. In other examples, PMOS transistors may be used for the switches SW41B, SW41C, SW41D, SW41E, SW41F, and SW41G.

The first terminal 682 of the IREF3 current mirror circuit 680A is coupled to the first terminal of the transistor MN41A and to the control terminals of the transistors MN41A, MN41B, MN41C, MN41D, MN41E, MN41F, and MN41G. The first terminal of the transistor MN41B is coupled to the first terminal of the switch SW41B. The first terminal of the transistor MN41C is coupled to the first terminal of the switch SW41C. The first terminal of the transistor MN41D is coupled to the first terminal of the switch SW41D. The first terminal of the transistor MN41E is coupled to the first terminal of the switch SW41E. The first terminal of the transistor MN41F is coupled to the first terminal of the switch SW41F. The first terminal of the transistor MN41G is coupled to the first terminal of the switch SW41G. The second terminals of the switches SW41B, SW41C, and SW41D are coupled to the second terminal 684 of the IREF3 current mirror circuit 680A. The second terminals of the switches SW41E, SW41F, and SW41G are coupled to the third terminal 686 of the IREF3 current mirror circuit 680A. The second terminals of the transistors MN41A, MN41B, MN41C, MN41D, MN41E, MN41F, and MN41G are coupled to a ground terminal or ground. The control terminals of the transistors SW41B, SW41C, SW41D, SW41E, SW41F, and SW41G are controlled by EEPROM/OTP memory bits (not shown), which are programmed so that the overall offset is as close to zero as possible during a circuit testing phase. In some examples, the IREF3 current mirror circuit 680 operates to: receive IREF3 at its first terminal 682; provide a first mirrored current at its second terminal 684 responsive to IREF3 and scaling control signals for switches SW41B, SW41C, and SW41D; and provide a second mirrored current at its third terminal 686 responsive to IREF3 and scaling control signals for switches SW41E, SW41F, and SW41G.

In some examples, the scaling control signals for the IREF1 current mirror circuit 660A, the IREF2 current mirror circuit 670A, and the IREF3 current mirror circuit 680A are obtained by testing the AMR sensor circuit 100F at different temperatures and generating the scaling control signals responsive to the testing results. When an AMR sensor is biased with VBIAS, it generates sine/cosine output signals (SIN+, SIN−, COS+, and COS−) with respect to an external magnet position. The sensed sine/cosine signals are processed to calculate the magnetic position angle. During the AMR sensing operations, an offset error (e.g., $V_{os1}$ herein) is added to the sine/cosine signals. The calibration process described herein adjusts $V_{os2}$ to cancel out $V_{os1}$ to facilitate position angle calculation accuracy.

In some examples, the trim circuits of FIGS. 7A to 7G are used with the AFE operational amplifier input stage of FIG. 6 to generate $V_{os2}$ to track and cancel out $V_{os1}$. Again, the AMR sensor 606 generates an offset Vos added to its differential output (SIN+ minus SIN−), where $V_{os1}$ is described in Equation (1). The AFE operational amplifier input stage includes input pair transistors MP0A and MP0B, and load transistors MN0A and MN0B. The input stage is biased with a tail current (I_TAIL), and the currents I_P and I_N are nominally balanced before offset trim. The offset trim cancellation is performed at the AFE operational amplifier input stage formed using the tail current transistor MP13, the input-pair transistors MP0A and MP0B, and load-pair transistor MN0A, MN0B. In some examples, both terms in Equation (1) are independently trimmed. Again, the first term of Equation (1) is a VBIAS dependent random variable, and the second term of Equation (1) is temperature drift dependent random variable.

In some examples, the constant Gm bias current generation circuit 654A of FIG. 7B provides two equal amount currents I1 and I2, which are forced into the transistors MP11 and MP12. The transistor MP11 may have a size P(W/L), where P is an integer greater than 1, W is width, and L is length. The transistor MP12 may have a size W/L. The equal amount currents I1 and I2 are guaranteed by a current mirror that includes MN11 and MN12. Each of the transistors MN11 and MN12 may have a size W/L. The gate-to-source voltage ($V_{GS}$) difference of the transistors MP11 and MP12 provides a voltage drop across the resistor $R_{1A}$. Accordingly:

$$V_{T,MP12} + \sqrt{\frac{2I_2}{k'\left(\frac{W}{L}\right)}} - \left(V_{T,MP11} + \sqrt{\frac{2I_1}{k'P\left(\frac{W}{L}\right)}}\right) = I_1 R_{1A}. \qquad \text{Equation (2b)}$$

In some examples, the transistors MP11 and MP12 are matching PMOS transistors with the similar threshold voltage: $V_{T,MP11} = V_{T,MP12}$. In such examples, $I_1$ and $I_2$ can be calculated using Equation (2b) as:

$$I_1 = I_2 = \frac{2}{k'\left(\frac{W}{L}\right)R_{1A}^2}\left(1 - \frac{1}{\sqrt{P}}\right)^2, \qquad \text{Equation (2c)}$$

where k' is Boltzmann's constant. The Gm of the transistor MP12 can be calculated as:

$$Gm_{MP12} = \sqrt{2\,k'\left(\frac{W}{L}\right)I_2} = \frac{2}{R_{1A}}\left(1 - \frac{1}{\sqrt{P}}\right). \qquad \text{Equation (2d)}$$

Accordingly, a constant-gm biasing current $I_2$ (independent of MOS process & temperature and inversely proportional to the value of the resistor $R_{1A}$) is generated. This biasing current is mirrored to the tail current of the AFE operational amplifier for biasing the input pair of transistors, MP0A and MP0B, for the AFE operational amplifier. In some examples, the transistors MP0A and MP0B have similar constant Gm, which is proportional to $1/R_{1A}$ over process and temperature variations. If the size ratio P between MP11 and MP12 is chosen to be 4, and the current going through MP12 is amplified by 2N times (by the current mirror formed using the transistors MP12 and MP13), then the transistors MP0A and MP0B may have a size N times larger than the size of the transistor MP12. In such case, $$g_{m,MP0A} =$$
$$g_{m,MP0B} = \sqrt{2\,k'N\left(\frac{W}{L}\right)NI_2} = \frac{2N}{R_{1A}}\left(1 - \frac{1}{\sqrt{4}}\right) = \frac{N}{R_{1A}}. \qquad \text{Equation (2e)}$$

In some examples, the IREF1 generation circuit 628A includes a voltage divider (e.g., the resistors $R_{2A}$ and $R_{2B}$) to divide VBIAS to provide a voltage V1=[$R_{2A}/(R_{2A}+R_{2B})$]*VBIAS. In the example of FIG. 7A, V1 is buffered by the operational amplifier OPA2 to drive the resistor $R_{1B}$. The reference current on $R_{1B}$ is IREF1=[$R_{2A}/(R_{2A}+R_{2B})$]*VBIAS/$R_{1B}$. If $R_{2A}=R_{2B}$, then IREF1 can be defined as:

$$IREF1 = \frac{V_{BIAS}}{2R_{1B}}. \qquad \text{Equation (3)}$$

In some examples, the IREF2 generation circuit 638A provides IREF2 as a PTAT reference current. In the example of FIG. 7C, the current mirror that includes the transistors MP31 and MP32 provides equal currents $I_{C\_Q1}$ and $I_{C\_Q2}$ that are injected into the transistors Q1 and Q2. In some examples, the transistor Q1 has emitter area A, and the transistor Q2 has an emitter area MA, where M is an integer greater than 1. The base-to-emitter voltage ($V_{BE}$) difference of the transistors Q1 and Q2 provide a voltage drop of the resistor Ric. In some examples, $I_{C\_Q1}$ is given as:

$$I_{C\_Q1} = I_S e^{\frac{V_{be,Q1}}{V_T}} = I_{C\_Q2} = MI_S e^{\frac{V_{be,Q2}}{V_T}}, \qquad \text{Equation (4a)}$$

where $I_S$ is the saturation current related to the emitter area. In such examples, $V_{be,Q1} - V_{be,Q2}$ is given as:

$$V_{be,Q1} - V_{be,Q2} = V_T \ln\left(\frac{I_{C\_Q1}}{I_S}\right) - V_T \ln\left(\frac{I_{C\_Q2}}{MI_S}\right) = \qquad \text{Equation (4b)}$$
$$V_T \ln(M) = IREF2 \times R_{1C},$$

and IREF2 is given as:

$$I\_REF2 = \frac{V_T \ln(M)}{R_{1C}} = \frac{\left(\frac{kT}{q}\right)\ln(M)}{R_{1C}} = \frac{kT \ln(M)}{qR_{1c}}, \qquad \text{Equation (4c)}$$

where k is Boltzmann constant, T is the absolute temperature, q is the charge of an electron.

Accordingly, in some examples, IREF2 is defined by resistor Ric and is copied by mirror MP32 to MP33 as a PTAT current. Since the absolute temperature T=temp+273=temp−27+300, Equation (4C) can be rewritten as:

$$IREF2 = \frac{k(\text{Temp} - 27)\ln(M)}{qR_{1C}} + \frac{300\,k\ln(M)}{qR_{1C}}. \qquad \text{Equation (4d)}$$

The first term in Equation (4d) is proportional to (temp-27). Accordingly, the first term in Equation (4d) has a format similar to the second term in Equation (1). The first term of Equation (4d) can thus be used to cancel out the second term in Equation (1). The second term in Equation (4d) can be further canceled with a constant reference current IREF3.

In some examples, the IREF3 generation circuit 648A provides IREF3 based on:

$$I\_REF3 = \frac{V_{BG}}{R_{1D}}. \qquad \text{Equation (5)}$$

In some examples, IREF1 (proportional to VBIAS/$R_{1B}$), IREF2 (proportional to $T/R_{1C}$), and IREF3 (proportional to $V_{BG}/R_{1D}$) are copied and selectively scaled through current mirrors provided by the IREF1 current mirror circuit 660A, the IREF2 current mirror circuit 670A, and the IREF3 current mirror circuit 680A. In some examples, current mirror circuits are programmed using values stored by an electrically-erasable programmable read-only memory (EE-PROM) and/or one-time programmable (OTP) values at the AFE operational amplifier NMOS load side. In some examples, the IREF1 current mirror circuit 660A includes the transistors MN21A, MN21B(×4), MN21C(×2), MN21D (×1), MN21E(×1), MN21F(×2) and MN21G(×4), with the size binary scaled on both positive and negative sides of the AFE operational amplifier input stage. The current going through the mirror and contributing to the current difference between I_P and I_N is controlled by the switches SW21B, SW21C, SW21D, SW21E, SW21F and SW21G. In some examples, these switches are turned on or turned off by 4-bit memory OTP/EEPROM trim code b[3:0]. The memory OTP/EEPROM bits are not shown in FIGS. 7E to 7G for simplicity.

In some examples, the most significant bit (MSB) b[3] of the trim code b[3:0] is used to control the offset trim direction. For example, the switches SW21B, SW21C, SW21D are turned on while the switches SW21E, SW21F, SW21G are turned off to select a first offset trim direction. To select a second offset trim direction, SW21B, SW21C, SW21D may be turned off while the switches SW21E, SW21F, and SW21G are turned on. The least significant bits (LSBs) b[2:0] are used for binary scale programming. In some examples, b[2] controls ×4 scale switches SW21B and SW21G, b[1] controls ×2 scale switches SW21C and SW21F, and b[0] controls ×1 scale switches SW21D and SW21E.

In some examples, the trim circuitry related to IREF2 may be programmed using OTP/EEROM memory trim code d[3:0]. The trim circuitry related IREF3 may be programmed using OTP/EEPROM memory trim code c[3:0]. The overall trim effect results in a current difference between I_P and I_N given as:

$$I\_P - I\_N = I_{REF1} \times (-1)^{b[3]}(4b[2] + 2b[1] + 1b[0]) + \qquad \text{Equation (6)}$$
$$I_{REF2} \times (-1)^{d[3]}(4d][2] + 2d[1] + 1d[0]) +$$
$$I_{REF3} \times (-1)^{c[3]}(4c[2] + 2c[1] + 1c[0]) =$$
$$\frac{V_{BIAS}}{R_{1B}} \times (-1)^{b[3]} \sum\nolimits_{i=0}^{2} 2^i b[i] +$$
$$\frac{kT \ln(M)}{qR_{1C}} \times (-1)^{d[3]} \sum\nolimits_{i=0}^{2} 2^i d[i] +$$
$$\frac{V_{BG}}{R_{1D}} \times (-1)^{c[3]} \sum\nolimits_{i=0}^{2} 2^i c[i].$$

To achieve the target equivalent offset $V_{os2}$, the trim effect can be referred to the input node, and the AFE operational amplifier input stage current difference (I_P–I_N) in Equation (6) can be divided by the input pair Gm in Equation (2e). In some examples, the resistor $R_{1A}$ in Equation (2e) and the resistors $R_{1B}$, $R_{1C}$, and $R_{1D}$ in Equation (6) are the same type of resistor and have matching layouts and values. In such examples, any mismatch between $R_{1A}$, $R_{1B}$, $R_{1C}$ and $R_{1D}$ track each other over manufacturing process variations and temperature variations, and can be cancelled out in first order.

In some examples, the current offset I_P–I_N is referred to the AFE operational input node to determine the equivalent offset $V_{os2}$. In such examples:

$$\text{Equation (7)}$$

$$V_{OS2} = \frac{I\_P - I\_N}{g_{m,MPoA}}$$
$$= \frac{\frac{V_{BIAS}}{2R_{1B}} \times (-1)^{b[3]} \sum\nolimits_{i=0}^{2} 2^i b[i] + \frac{kTin(M)}{qR_{1C}} \times (-1)^{d[3]} \sum\nolimits_{i=0}^{2} 2^i d[i] + \frac{V_{BG}}{R_{1D}} \times (-1)^{c[3]} \sum\nolimits_{i=0}^{2} 2^i c[i]}{\frac{N}{R_{1A}}}$$
$$= \frac{V_{BIAS}}{2N} \times (-1)^{b[3]} \sum\nolimits_{i=0}^{2} 2^i b[i] + \frac{kT \ln(M)}{qN} \times$$
$$(-1)^{d[3]} \sum\nolimits_{i=0}^{2} 2^i d[i] + \frac{V_{BG}}{N} \times (-1)^{c[3]} \sum\nolimits_{i=0}^{2} 2^i c[i]$$
$$= \frac{V_{BIAS}}{2N} \times (-1)^{b[3]} \sum\nolimits_{i=0}^{2} 2^i b[i] + \frac{k(temp - 27) \ln(M)}{qN} \times$$
$$(-1)^{d[3]} \sum\nolimits_{i=0}^{2} 2^i d[i] + \frac{300 k \ln(M)}{qN} \times$$
$$(-1)^{d[3]} \sum\nolimits_{i=0}^{2} 2^i d[i] + \frac{V_{BG}}{N} \times (-1)^{c[3]} \sum\nolimits_{i=0}^{2} 2^i c[i].$$

In Equation (7), $V_{os2}$ has four terms. The first term is proportional to VBIAS. The second term is proportional to the temperature drift (temp-27). Accordingly, the first term and the second term for $V_{os2}$ correspond to the two terms for $V_{os1}$ in Equation (1). The third term for $V_{os2}$ is a side effect constant to be canceled by the fourth term. The trim bits b[3:0], d[3:0] and c[3:0] are used to balance out the randomness of $V_{os1}$ expressed in Equation (1). The $V_{os2}$ results are only related to the current mirror ratio N (e.g., the size of the transistor MP13 relative to the size of the transistor MP12, and/or the size of the transistor MP0A relative to the size of the transistor MP12) and the emitter area ratio M (NPN device Q2 and Q1). Here, N and M are integer numbers that can be easily implemented in circuit design and layout to maintain high accuracy, by using multiple copies of the unit component. Other parameters in Equation (6), such as k (Boltzmann's constant) and q (charge of an electron) are physics constants. Accordingly, the trim circuitry can achieve fairly high accuracy.

Once the randomness of $V_{os1}$ in Equation (1) is determined by the trim bits b[3:0] and the randomness of TC1 is determined by the trim bits d[3:0] in Equation (6), $V_{os2}$ and $V_{os1}$ track each other and cancel out over process and temperature variations as well as VBIAS variance.

As indicated in Equations (4c) and (4d), the trim code d[3:0] moves the offset TC ramp which has offset zero crossing at temp=−273 C. The DC shift of the second term in Equation (4d) results in the offset drift from −40C to 150C occurring either inside positive or negative range. Accordingly, the trim technique is valid even if $V_{os1}$ drifts across the zero line.

FIGS. 8A to 8D and 9 are graphs showing example AMR sensor circuit offset trim procedures. In some examples, the example AMR sensor signals relate to a two-temperature trim process. In FIGS. 8A to 8D, four cases 800, 810, 820, and 830 of the AMR sensor offset trim steps are plotted. In each plot, the vertical axis is offset voltage with polarity definition, the horizontal axis is the temperature ranges from −40 C degree to 150 C degree.

Figure 8A:
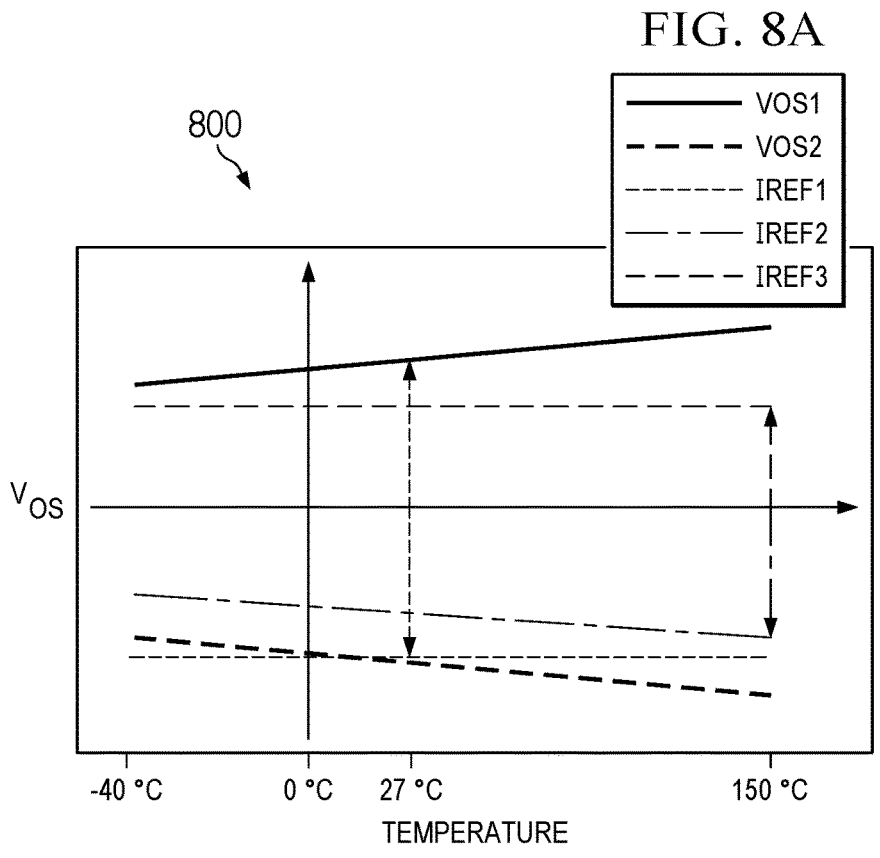
FIGS. 8A to 8D and 9 are graphs showing example AMR offset trim procedures.

In case 800 of FIG. 8A, an example AMR sensor has a positive $V_{os1}$ at room temperature and a positive temperature coefficient (TC) (i.e., $V_{os1}$ increases as the temperature increases). In some examples, a first trim operation (trim at Temp=27° C.) involves adjusting IREF1 scaling (e.g., 1×, 2×, or 4× scaling) using the related trim code b[3:0]. The first trim operation adjusts IREF1 scaling so that the trim offset amount in the negative direction cancels out the $V_{os1}$ amount at 27° C. Using Equation (7), applying the trim code b[3]=1 results in $(-1)^{b[3]}=-1$. Accordingly, the offset trim contribution of b[2:0] is in a negative direction to cancel out the positive $V_{os1}$. In a second trim operation, the temperature is moved from 27° C. to 150° C. With the second trim operation, $V_{os1}$ is no longer balanced with IREF1 because $V_{os1}$ drifts higher as temperature increases. Accordingly, IREF2 (the PTAT current) scaling (e.g., 1×, 2×, or 4× scaling) is adjusted during the second trim operation using the related trim code d[3:0]. Applying d[3]=1 results in a d[2:0] offset trim contribution in the negative direction. Also, the combined effect of scaling IREF1, IREF2, and IREF3 results in a $V_{os2}$ that cancels out $V_{os1}$ over the whole temperature range. In the first trim operation, only the IREF1 related trim code b[3:0] is used at Temp=27° C. In the second trim operation at Temp=150° C., the IREF2 related trim code d[3:0] and the IREF3 related trim code c[3:0] are used. This is because in the second trim operation, the offset that is trimmed is only the net drift amount resulting from the change in temperature from 27° C. to 150° C. The trim code c[3:0] is adjusted in the second trim operation to compensate for the side-effect caused by IREF2 related trim code d[3:0].

Figure 8B:
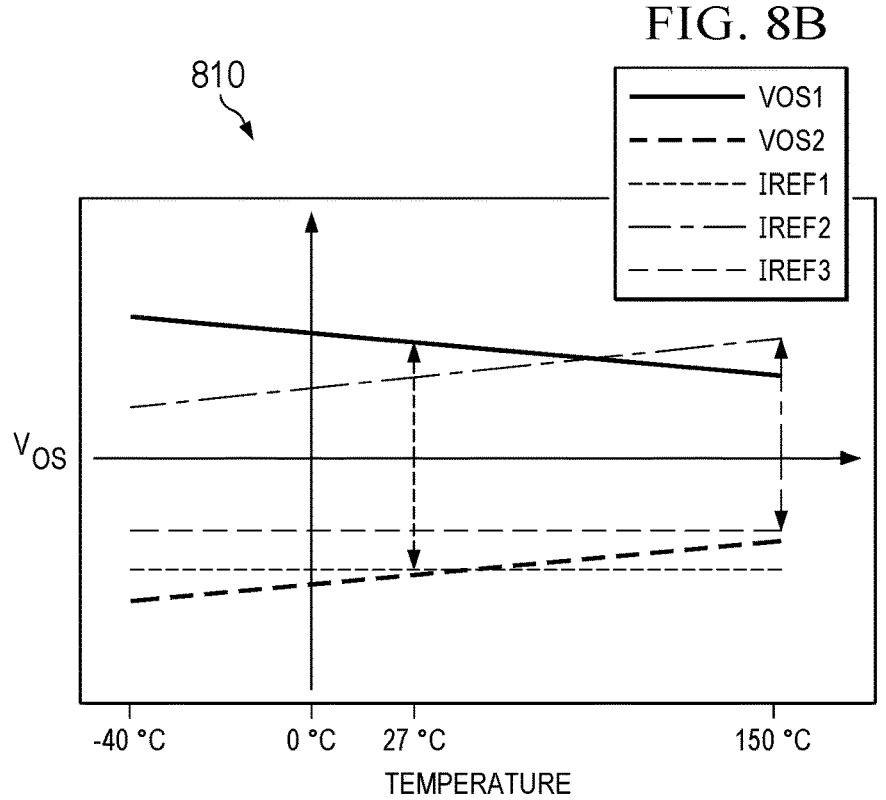

In case 810 of FIG. 8B, an example AMR sensor has a positive $V_{os1}$ at room temperature and a negative TC (i.e., $V_{os1}$ decreases as the temperature increases). In some examples, a first trim operation (trim at Temp=27° C.) involves adjusting IREF1 scaling using the related trim code b[3:0]. The first trim operation adjusts IREF1 so that the trim offset amount in the negative direction cancels out the $V_{os1}$ amount at 27° C. Using Equation (7), applying the trim code b[3]=1 results in $(-1)^{b[3]}=-1$. Accordingly, the offset trim contribution of b[2:0] is in negative direction to cancel out the positive $V_{os1}$. In a second trim operation, the temperature is moved from 27° C. to 150° C. With the second trim operation, $V_{os1}$ is no longer balanced with IREF1 at Temp=150° C. because $V_{os1}$ drifts lower as temperature increases. Accordingly, IREF2 (the PTAT current) scaling is adjusted during the second trim operation using the related trim code d[3:0]. Applying d[3]=0 results in $(-1)^{d[3]}=+1$ and results in a d[2:0] offset trim contribution having a positive direction. Also, IREF3 scaling (e.g., 1×, 2×, or 4× scaling) is adjusted using the trim code c[3:0] in a negative direction. Thus, the combined effect of scaling IREF1, IREF2, and IREF3 results in a $V_{os2}$ that cancels out $V_{os1}$ over the whole temperature range. In the first trim operation, only the IREF1 related trim code b[3:0] is used at Temp=27° C. In the second trim operation at Temp=150° C., the IREF2 related trim code d[3:0] and the IREF3 related trim code c[3:0] are used. This is because in the second trim operation, the offset that is trimmed is only the net drift amount resulting from the change in temperature from 27° C. to 150° C. The trim code c[3:0] is adjusted in the second-step trim operation to compensate for the side-effect caused by the IREF2 related trim code d[3:0].

Figure 8C:
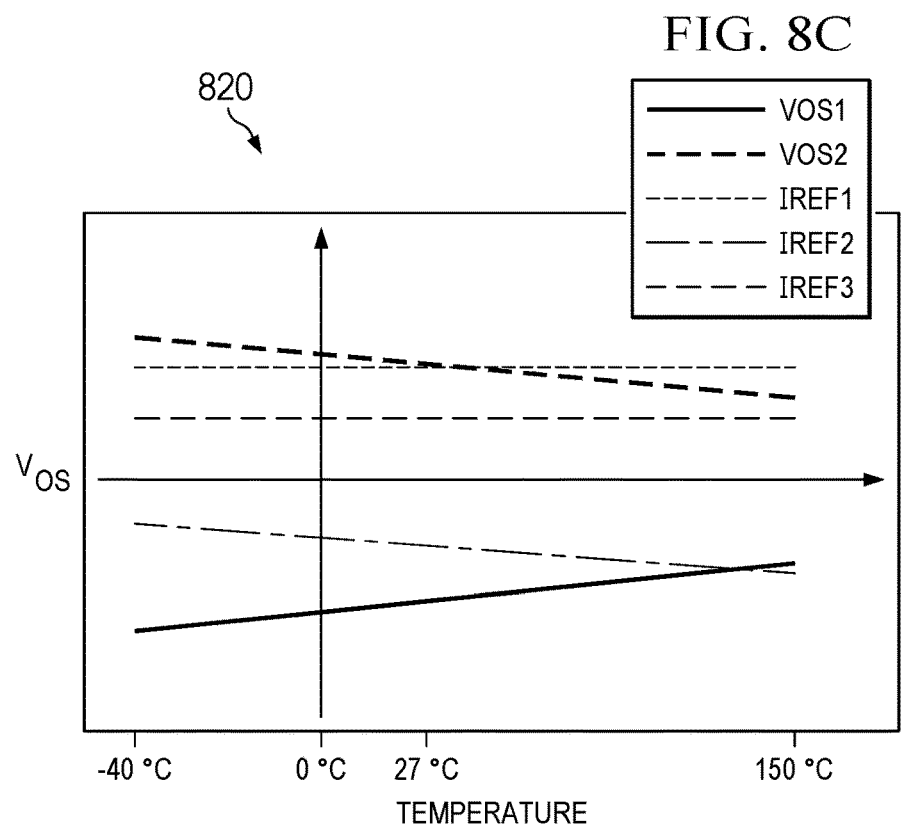

In case 820 of FIG. 8C, an example AMR sensor has a negative $V_{os1}$ at room temperature and a positive temperature coefficient (TC) (i.e., $V_{os1}$ increases as the temperature increases). In some examples, a first trim operation (trim at Temp=27° C.) involves adjusting IREF1 scaling using the related trim code b[3:0]. The first trim operation adjusts IREF1 scaling so that the trim offset amount in the positive direction cancels out the Vos amount at 27° C. Using Equation (7), applying the trim code b[3]=0 results in $(-1)^{b[3]}=1$. Accordingly, the offset trim contribution of b[2:0] is in a positive direction to cancel out the negative $V_{os1}$. In a second trim operation, the temperature is moved from 27° C. to 150° C. With the second trim operation, $V_{os1}$ is no longer balanced with IREF1 because $V_{os1}$ drifts higher as temperature increases. Accordingly, IREF2 (the PTAT current) scaling is adjusted during the second trim operation using the related trim code d[3:0]. Applying d[3]=1 results in a d[2:0] offset trim contribution in the negative direction. Also, adjusting the trim code c[3:0] moves IREF3 up. Thus, the combined effect of scaling IREF1, IREF2, and IREF3 results in a $V_{os2}$ that cancels out $V_{os1}$ over the whole temperature range. In the first trim operation, only the IREF1 related trim code b[3:0] is used at Temp=27° C. In the second trim operation at Temp=150° C., the IREF2 related trim code d[3:0] and the IREF3 related trim code c[3:0] are used. This is because in the second trim operation, the offset that is trimmed is only the net drift amount resulting from the change in temperature from 27° C. to 150° C. The trim code c[3:0] is adjusted in the second trim operation to compensate for the side-effect caused by IREF2 related trim code d[3:0].

Figure 8D:
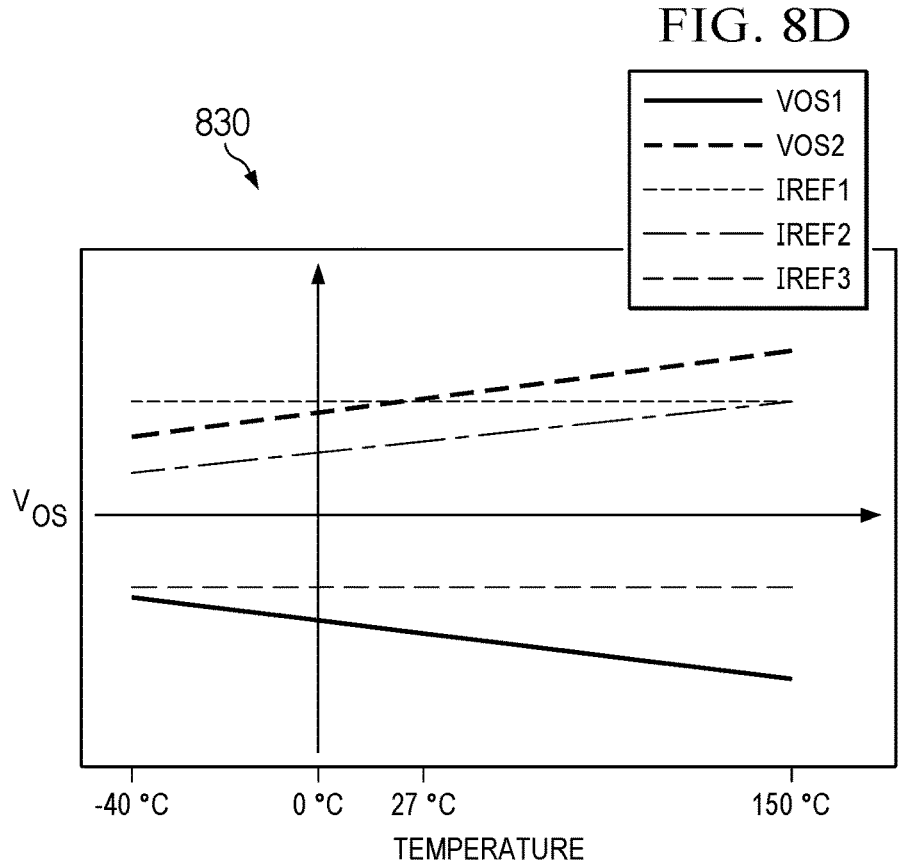

In case 830 of FIG. 8D, an example AMR sensor has a negative $V_{os1}$ at room temperature and a negative TC (i.e., $V_{os1}$ decreases as the temperature increases). In some examples, a first trim operation (trim at Temp=27° C.) involves adjusting IREF1 scaling using the related trim code b[3:0]. The first trim operation adjusts IREF1 so that the trim offset amount in the positive direction cancels out the $V_{os1}$ amount at 27° C. Using Equation (7), applying the trim code b[3]=0 results in $(-1)^{b[3]}=1$. Accordingly, the offset trim contribution of b[2:0] is in positive direction to cancel out the negative $V_{os1}$. In a second trim operation, the temperature is moved from 27° C. to 150° C. With the second trim operation, $V_{os1}$ is no longer balanced with IREF1 at Temp=150° C. because $V_{os1}$ drifts lower as temperature increases. Accordingly, IREF2 (the PTAT current) scaling is adjusted during the second trim operation using the related trim code d[3:0]. Applying d[3]=0 results in $(-1)^{d[3]}=+1$ and results in a d[2:0] offset trim contribution having a positive direction. Also, IREF3 scaling is adjusted using the trim code c[3:0] in a negative direction. Thus, the combined effect of scaling IREF1, IREF2, and IREF3 results in a $V_{os2}$ that cancels out $V_{os1}$ over the whole temperature range. In the first trim operation, only the IREF1 related trim code b[3:0] is used at Temp=27° C. In the second trim operation at Temp=150° C., the IREF2 related trim code d[3:0] and the IREF3 related trim code c[3:0] are used. This is because in the second trim operation, the offset that is trimmed is only the net drift amount resulting from the change in temperature from 27° C. to 150° C. The trim code c[3:0] is adjusted in the second trim operation to compensate for the side-effect caused by the IREF2 related trim code d[3:0].

Figure 9:
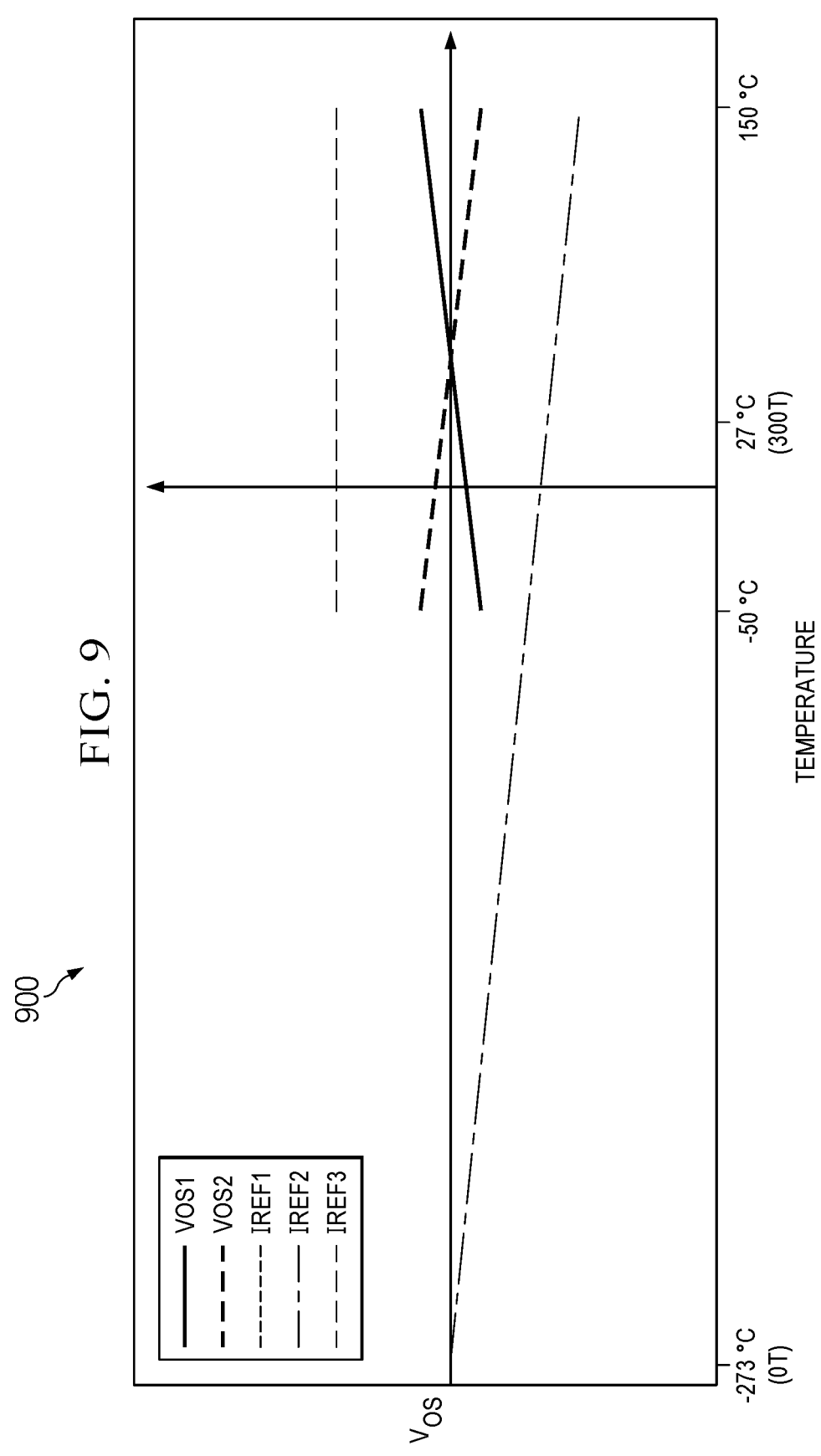

In case 900 of FIG. 9, an example AMR sensor has a zero (or very close to zero) $V_{os1}$ at room temperature and a non-zero positive TC (i.e., $V_{os1}$ increases as the temperature increases). Accordingly, for this example AMR sensor, the first term in Equation (1) is zero, but the second term in Equation (1) is not zero. In this case, $V_{os1}$ crosses the zero line at Temp=27. Accordingly, $V_{os2}$ (e.g., a mirror of $V_{os1}$ with respect to the zero line) also will have a zero-crossing at the same temperature spot but in the opposite direction. However, the EEPROM/OTP offset trim bits are only programmed once before the related product is shipped out. Once the EEPROM/OTP is programmed, IREF1 trim bits (e.g., temperature drift related trim bits, including a sign bit) is fixed and does not change when $V_{os1}$ changes its direction crosses the zero line. To solve this problem, as illustrated in FIG. 9, $V_{os2}$ uses a combination of scaling IREF2 and IREF3 to cancel out $V_{os1}$. This operation can be seen using Equation (4c) and Equation (4d). By using T=Temp+273=(Temp-27)+300, where (Temp-27) reflects the actual temperature difference drift from 27 C degree, the temperature constant-shift of 300 degree moves the IREF2 zero-crossing spot to Temp=−273° C. (i.e., absolute temperature OT degrees), which is completely out of the target operational temperature range (e.g., −50° C. to 150° C.). Accordingly, the second term in Equation (4d) (i.e., the constant shift term) is canceled by the IREF3 trim bits. Meanwhile, the IREF2 (the PTAT current) related offset trim is in either the positive half-plane or the negative half-plane and does not cross line zero in the target operational temperature range. The description of FIG. 9 is applicable to the case with zero room-temp offset and a non-zero negative TC AMR offset. This means the offset trim technique is still valid even if the $V_{os1}$ drifts across the zero line.

Figure 10:
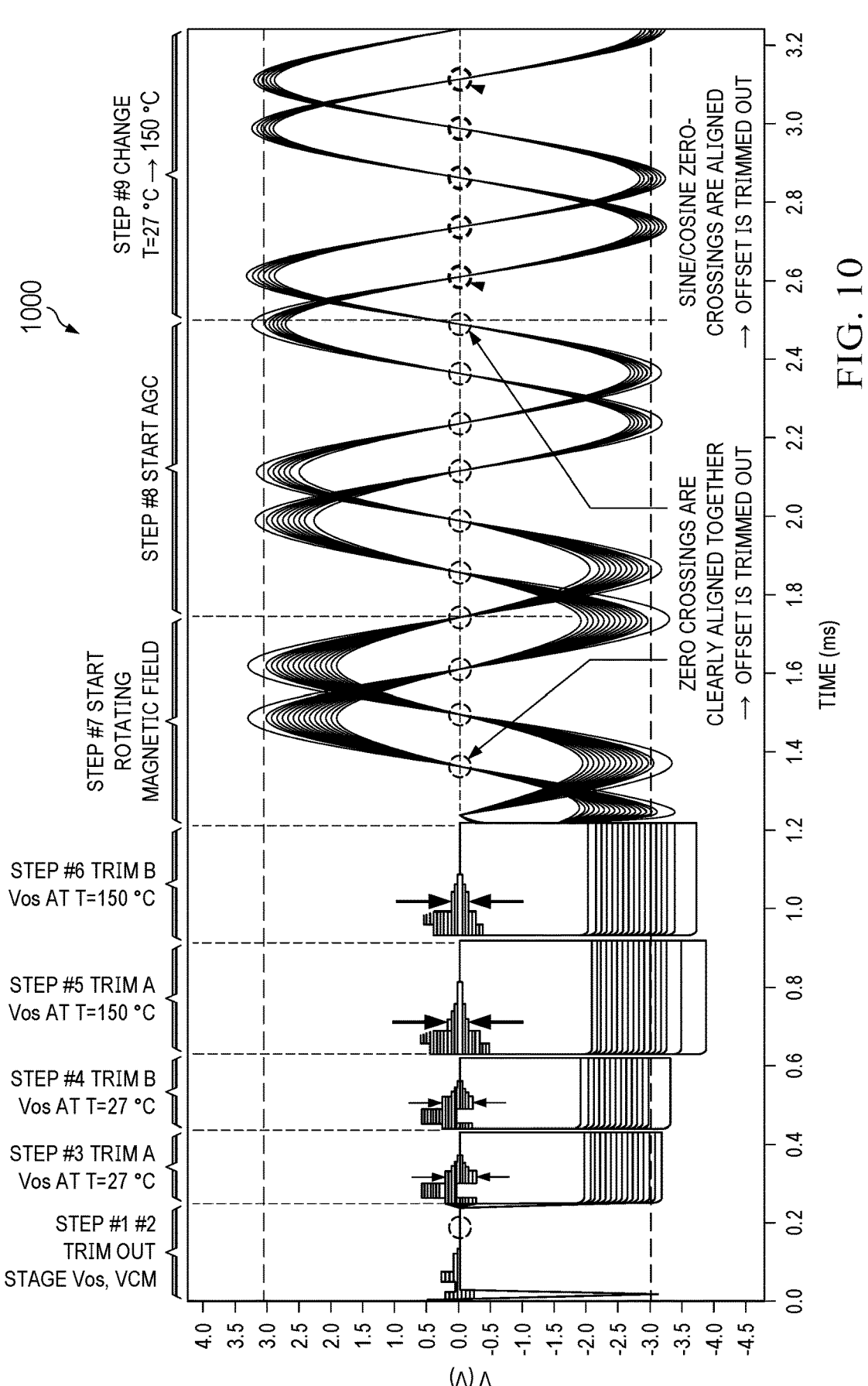
FIG. 10 is a graph showing an example trim process for an AMR sensor circuit.

FIG. 10 is a graph 1000 showing an example trim process for an AMR sensor circuit. In steps 1 and 2 of the trim process of graph 1000 (e.g., from 0ms to 0.25 ms), an output stage offset and a common-mode voltage are trimmed. In step 3 of the trim process of graph 1000 (e.g., from 0.25 ms to 0.44 ms), a first channel (e.g., channel A or Sine channel) offset is trimmed at T=27° C. By applying an external magnetic angle 0 degrees, the sine channel signal sin (2θ)=0. Accordingly, whatever is measured at the output stage is only the first channel (e.g., the sine channel) offset amplified by some gain. In step 3, an initial first channel offset (about +/−250 mV) indicated by arrows is trimmed out resulting in a residue offset of less than +/−10 mV at the end of step 3. Similar trim operations are performed in step 4 of the trim process of graph 1000 (e.g., from 0.44 ms to 0.64 ms) for a second channel (e.g., channel B or Cosine channel). By applying an external magnetic angle of +45 degrees, the cos (2θ)=0. Accordingly, whatever is measured at the output stage is only the second channel offset amplified by some gain. In step 4, an initial second channel offset (about +/−250 mV) indicated by arrows is trimmed out resulting in a residue offset of less than +/−10 mV at the end of step 4.

In step 5 of the trim process of graph 1000 (e.g., from 0.64 ms to 0.92 ms), the temperature is raised from a first target temperature (e.g., 27° C.) to a second target temperature (e.g., 150° C.) and first channel offset drift is trimmed out resulting in a residue offset of less than +/−10 mV at the end of step 5. In step 6 of the trim process of graph 1000 (e.g., from 0.92 ms to 1.21 ms), the temperature is raised from a first target temperature (e.g., 27° C.) to a second target temperature (e.g., 150° C.). Thus, the second channel offset drift is trimmed out resulting in a residue offset of less than +/−10 mV at the end of step 6. In step 7 of the trim process of graph 1000 (e.g., starting at 1.21 ms), the trim process is complete, and magnetic field rotation (e.g., a 2 kHz rotation) begins. As shown in graph 1000, the sine/cosine wave zero-crossings are all clearly aligned at one spot close to zero. This is because that the first channel offset and the second channel offset have been trimmed out. Only a small amount of residue offset (e.g., less than +/−10 mV) is left at the zero crossing spots. Comparing the offset residue (e.g., less than +/−10 mV) to the signal amplitude (+/−3V), the ratio is about +/10 mV/3V=0.33%, which is less than a target tolerance of 0.36%. Accordingly, the position angle calculation error is less than 0.5 degrees.

Figure 11:
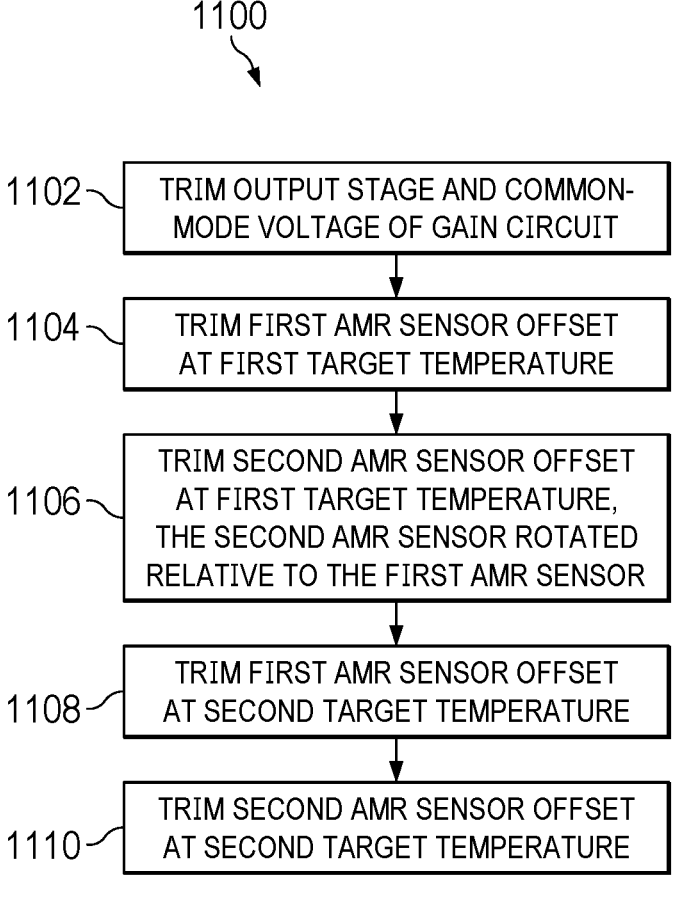
FIG. 11 is a flowchart showing an example AMR sensor calibration method.

FIG. 11 is a flowchart showing an example AMR sensor calibration method 1100. The method 1100 is performed using an AMR sensor circuit (e.g., any of the AMR sensors circuits 100, 100A to 100F described herein) and test circuitry. As shown, the method 1100 includes trimming an output stage of common-mode voltage of a gain circuit at block 1102. At block 1104, a first AMR sensor offset (e.g., related to a first channel such as the Sine channel described herein) is trimmed at a first target temperature. At block 1106, a second AMR sensor offset (e.g., related to a second channel such as the Cosine channel described herein) is trimmed at the first target temperature. At block 1108, the first AMR sensor offset is trimmed at a second target temperature. At block 1110, the second AMR sensor offset is trimmed at the second target temperature.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field-effect transistor ("FET") such as an NFET or a PFET, a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control terminal and its first and second terminals. In the context of a FET, the control terminal is the gate, and the first and second terminals are the drain and source. In the context of a BJT, the control terminal is the base, and the first and second terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A circuit comprising:

an anisotropic magnetoresistance (AMR) sensor having a first terminal, a second terminal, a third terminal, and a fourth terminal;

an operational amplifier having a first terminal, a second terminal, a third terminal, and a fourth terminal, the first terminal of the operational amplifier coupled to the second terminal of the AMR sensor, the second terminal of the operational amplifier coupled to the third terminal of the AMR sensor; and a calibration circuit coupled to the first terminal of the operational amplifier, the calibration circuit configured to provide an adjustable offset trim voltage at the first terminal of the operational amplifier to cancel out an offset voltage generated by the AMR sensor; and a bias voltage source having a terminal, wherein the operational amplifier includes a first transistor and a second transistor, the first transistor having a first terminal, a second terminal, and a control terminal, the second transistor having a first terminal, a second terminal, and a control terminal, the control terminal of the first transistor coupled to the first terminal of the operational amplifier, the control terminal of the second transistor coupled to the second terminal of the operational amplifier, wherein the calibration circuit includes a third transistor and a transconductance bias current generation circuit, the third transistor having a first terminal, a second terminal, and a control terminal, the transconductance bias current generation circuit having a first terminal and a second terminal, the first terminal of the third transistor coupled to the terminal of the bias voltage source, the second terminal of the third transistor coupled to the first terminals of the first and second transistors, the first terminal of the transconductance bias current generation circuit coupled to the terminal of the bias voltage source, and the second terminal of the transconductance bias current generation circuit coupled to the control terminal of the third transistor.

2. The circuit of claim 1, wherein the calibration circuit includes a first reference current generation circuit and a first current mirror circuit, the first reference current generation circuit having a first terminal and a second terminal, the first current mirror circuit having a first terminal, a second terminal, and a third terminal, the first terminal of the first reference current generation circuit coupled to the terminal of the bias voltage source, the second terminal of the first reference current generation circuit coupled to the first terminal of the first current mirror circuit, the second terminal of the first current mirror circuit coupled to the second terminal of the first transistor, and the third terminal of the first current mirror circuit coupled to the second terminal of the second transistor.

3. A circuit comprising:

an anisotropic magnetoresistance (AMR) sensor having a first terminal, a second terminal, a third terminal, and a fourth terminal;

an operational amplifier having a first terminal, a second terminal, a third terminal, and a fourth terminal, the first terminal of the operational amplifier coupled to the second terminal of the AMR sensor, the second terminal of the operational amplifier coupled to the third terminal of the AMR sensor; and a calibration circuit coupled to the first terminal of the operational amplifier, the calibration circuit configured to provide an adjustable offset trim voltage at the first terminal of the operational amplifier to cancel out an offset voltage generated by the AMR sensor and a bias voltage source having a terminal, wherein the operational amplifier includes a first transistor and a second transistor, the first transistor having a first terminal, a second terminal, and a control terminal, the second transistor having a first terminal, a second terminal, and a control terminal, the control terminal of the first transistor coupled to the first terminal of the operational amplifier, the control terminal of the second transistor coupled to the second terminal of the operational amplifier, wherein the calibration circuit includes:

a first reference current generation circuit and a first current mirror circuit, the first reference current generation circuit having a first terminal and a second terminal, the first current mirror circuit having a first terminal, a second terminal, and a third terminal, the first terminal of the first reference current generation circuit coupled to the terminal of the bias voltage source, the second terminal of the first reference current generation circuit coupled to the first terminal of the first current mirror circuit, the second terminal of the first current mirror circuit coupled to the second terminal of the first transistor, and the third terminal of the first current mirror circuit coupled to the second terminal of the second transistor; and a second reference current generation circuit and a second current mirror circuit, the second reference current generation circuit having a first terminal and a second terminal, the second current mirror circuit having a first terminal, a second terminal, and a third terminal, the first terminal of the second reference current generation circuit coupled to the terminal of the bias voltage source, the second terminal of the second reference current generation circuit coupled to the first terminal of the second current mirror circuit, the second terminal of the second current mirror circuit coupled to the second terminal of the first transistor, and the third terminal of the second current mirror circuit coupled to the second terminal of the second transistor.

4. The circuit of claim 3, wherein the calibration circuit includes a third reference current generation circuit and a third current mirror circuit, the third reference current generation circuit having a first terminal and a second terminal, the third current mirror circuit having a first terminal, a second terminal, and a third terminal, the first terminal of the third reference current generation circuit coupled to the terminal of the bias voltage source, the second terminal of the third reference current generation circuit coupled to the first terminal of the third current mirror circuit, the second terminal of the third current mirror circuit coupled to the second terminal of the first transistor, and the third terminal of the third current mirror circuit coupled to the second terminal of the second transistor.

5. The circuit of claim 3, wherein the calibration circuit includes a third transistor and a transconductance bias current generation circuit, the third transistor having a first terminal, a second terminal, and a control terminal, the transconductance bias current generation circuit having a first terminal and a second terminal, the first terminal of the third transistor coupled to the terminal of the bias voltage source, the second terminal of the third transistor coupled to the first terminals of the first and second transistors, the first terminal of the transconductance bias current generation circuit coupled to the terminal of the bias voltage source, and the second terminal of the transconductance bias current generation circuit coupled to the control terminal of the third transistor.

6. The circuit of claim 1, wherein the calibration circuit is configured to provide a positive offset trim voltage that increases as temperature increases.

7. The circuit of claim 1, wherein the calibration circuit is configured to provide a positive offset trim voltage that decreases as temperature increases.

8. The circuit of claim 1, wherein the calibration circuit is configured to provide a negative offset trim voltage that increases as temperature increases.

9. The circuit of claim 1, wherein the calibration circuit is configured to provide a negative offset trim voltage that decreases as temperature increases.

10. A circuit comprising:

a first anisotropic magnetoresistance (AMR) sensor having a first terminal, a second terminal, a third terminal, and a fourth terminal;

a first operational amplifier having a first terminal, a second terminal, a third terminal, and a fourth terminal, the first terminal of the first operational amplifier coupled to the second terminal of the first AMR sensor, the second terminal of the first operational amplifier coupled to the third terminal of the first AMR sensor;

a first calibration circuit coupled to the first terminal of the first operational amplifier, the first calibration circuit configured to provide an offset trim voltage at the first terminal of the first operational amplifier that varies as a function of temperature;

a second AMR sensor having a first terminal, a second terminal, a third terminal, and a fourth terminal, the second AMR sensor rotated relative to the first AMR sensor;

a second operational amplifier having a first terminal, a second terminal, a third terminal, and a fourth terminal, the first terminal of the second operational amplifier coupled to the second terminal of the second AMR sensor, the second terminal of the second operational amplifier coupled to the third terminal of the second AMR sensor; and a second calibration circuit coupled to the first terminal of the second operational amplifier, the second calibration circuit configured to provide an offset trim voltage at the first terminal of the second operational amplifier that varies as a function of temperature;

wherein the first calibration circuit is configured to:

trim an output stage offset and a common-mode voltage of the first operational amplifier;

trim an offset voltage applied to the first operational amplifier at a first target temperature;

trim an offset voltage applied to the first operational amplifier at a second target temperature; and wherein the second calibration circuit is configured to:

trim an output stage offset and a common-mode voltage of the second operational amplifier;

trim an offset voltage applied to the second operational amplifier at a first target temperature; and trim an offset voltage applied to the second operational amplifier at a second target temperature.

11. The circuit of claim 10, further comprising position monitoring circuitry coupled to the third and fourth terminals of the first operational amplifier and to the third and fourth terminals of the second operational amplifier, the position monitoring circuitry configured to:

receive first AMR results from the third and fourth terminals of the first operational amplifier;

receive second AMR results from the third and fourth terminals of the second operational amplifier; and determine a position parameter responsive to the first AMR results and the second AMR results.

12. The circuit of claim 11, wherein the position monitoring circuitry includes analog-to-digital converters (ADCs) and a processor, the ADCs configured to:

digitize first AMR sensor results from the first AMR sensor; and digitize second AMR sensor results from the second AMR sensor; and the processor configured to:

receive the digitized first AMR sensor results;

receive the digitized second AMR sensor results; and determine position results responsive to the digitized first and second AMR sensor results.

13. The circuit of claim 11, further comprising motor control circuitry coupled to the position monitoring circuitry, the motor control circuitry configured to provide motor control signals responsive to position results determined by the position monitoring circuitry based on first AMR sensor results from the first AMR sensor and second AMR sensor results from the second AMR sensor.

14. An anisotropic magnetoresistance (AMR) sensor circuit comprising:

an AMR sensor configured to:

receive a voltage; and provide AMR sensor results responsive to the voltage and an ambient magnetic field;

a gain circuit coupled to the AMR sensor and configured to provide amplified results responsive to AMR sensor results; and a calibration circuit coupled to the gain circuit, the calibration circuit configured to;

apply a correction to the amplified results, wherein the correction varies as a function of temperature;

apply a correction to a proportional to absolute temperature (PTAT) current based on:

trimming an output stage offset and a common-mode voltage of the gain circuit;

trimming an offset voltage applied to the gain circuit at a first target temperature; and trimming an offset voltage applied to the gain circuit at a second target temperature.

15. The AMR sensor circuit of claim 14, wherein the calibration circuit is configured to apply an offset trim voltage to the gain circuit, the offset trim voltage increasing as temperature increases.

16. The AMR sensor circuit of claim 14, wherein the calibration circuit is configured to apply an offset trim voltage to the gain circuit, the offset trim voltage decreasing as temperature increases.

17. The AMR sensor circuit of claim 14, wherein the calibration circuit is configured to apply an offset trim voltage to the gain circuit, the offset trim voltage based on a first term and a second term, the first term proportional to a bias voltage, and the second term proportional to the PTAT current.

18. The circuit of claim 1, wherein the bias voltage source comprises a linear dropout regulator (LDO) having an output configured to provide a bias voltage at the terminal of the bias voltage source.

19. The circuit of claim 3, wherein the bias voltage source comprises a linear dropout regulator (LDO) having an output configured to provide a bias voltage at the terminal of the bias voltage source.

20. The circuit of claim 3, wherein the calibration circuit is configured to provide an offset trim voltage that changes as temperature changes.

* * * * *